(12) United States Patent
Enami et al.

(10) Patent No.: US 9,943,007 B2
(45) Date of Patent: Apr. 10, 2018

(54) POWER CONVERTER FOR RAILROAD VEHICLE

(71) Applicant: FUJI ELECTRIC CO., LTD., Kawasaki-shi, Kanagawa (JP)

(72) Inventors: Yoshiaki Enami, Hino (JP); Yoshihisa Uehara, Hino (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/468,253

(22) Filed: Mar. 24, 2017

(65) Prior Publication Data

US 2017/0303430 A1 Oct. 19, 2017

(30) Foreign Application Priority Data

Apr. 15, 2016 (JP) ................. 2016-081878

(51) Int. Cl.
| | |
|---|---|
| H05K 7/20 | (2006.01) |
| B61D 27/00 | (2006.01) |
| B61C 3/00 | (2006.01) |

(52) U.S. Cl.
CPC ........... *H05K 7/20145* (2013.01); *B61C 3/00* (2013.01); *B61D 27/0072* (2013.01); *H05K 7/20409* (2013.01)

(58) Field of Classification Search
None
See application file for complete search history.

(56) References Cited

U.S. PATENT DOCUMENTS

| | | | | |
|---|---|---|---|---|
| 5,077,601 A | * | 12/1991 | Hatada | H01L 23/467 165/80.3 |
| 5,894,987 A | * | 4/1999 | Layne | B60H 1/00764 165/44 |
| 6,504,714 B1 | * | 1/2003 | Richter | H05K 7/20572 361/695 |
| 7,310,228 B2 | * | 12/2007 | Chen | H05K 7/20154 165/104.33 |
| 7,447,021 B2 | * | 11/2008 | Chen | G06F 1/20 361/679.48 |
| 8,325,479 B2 | * | 12/2012 | Siracki | H05K 7/20918 361/678 |
| 8,854,807 B2 | * | 10/2014 | Hoffmann | H05K 7/20909 165/80.3 |
| 8,913,385 B2 | * | 12/2014 | Downing | H01L 23/467 165/104.33 |
| 9,192,079 B2 | * | 11/2015 | Loth | H05K 7/20918 |
| 2010/0277871 A1 | * | 11/2010 | Kitanaka | B60L 9/16 361/710 |

(Continued)

FOREIGN PATENT DOCUMENTS

| | | |
|---|---|---|
| JP | 3469475 B2 | 11/2003 |
| JP | 2007-184464 A | 7/2007 |
| JP | 2013-115995 A | 6/2013 |

*Primary Examiner* — Courtney Smith
(74) *Attorney, Agent, or Firm* — Manabu Kanesaka

(57) ABSTRACT

A power converter for a railroad vehicle includes an air guide duct that takes air from a lateral side of one of a first heat radiating fin and a second heat radiating fin, guides the taken air to a region between the first heat radiating fin and the second heat radiating fin, and then guides the taken air to an end of the other of the first heat radiating fin and the second heat radiating fin in a running direction when the railroad vehicle is running.

16 Claims, 13 Drawing Sheets

(56) References Cited

U.S. PATENT DOCUMENTS

| | | | |
|---|---|---|---|
| 2014/0254097 A1* | 9/2014 | Kohn | G06F 1/181 |
| | | | 361/697 |
| 2014/0301041 A1* | 10/2014 | Kitanaka | H02M 7/003 |
| | | | 361/697 |
| 2014/0330461 A1 | 11/2014 | Ueno et al. | |
| 2015/0277518 A1* | 10/2015 | Farrow | G06F 1/20 |
| | | | 361/679.5 |

* cited by examiner

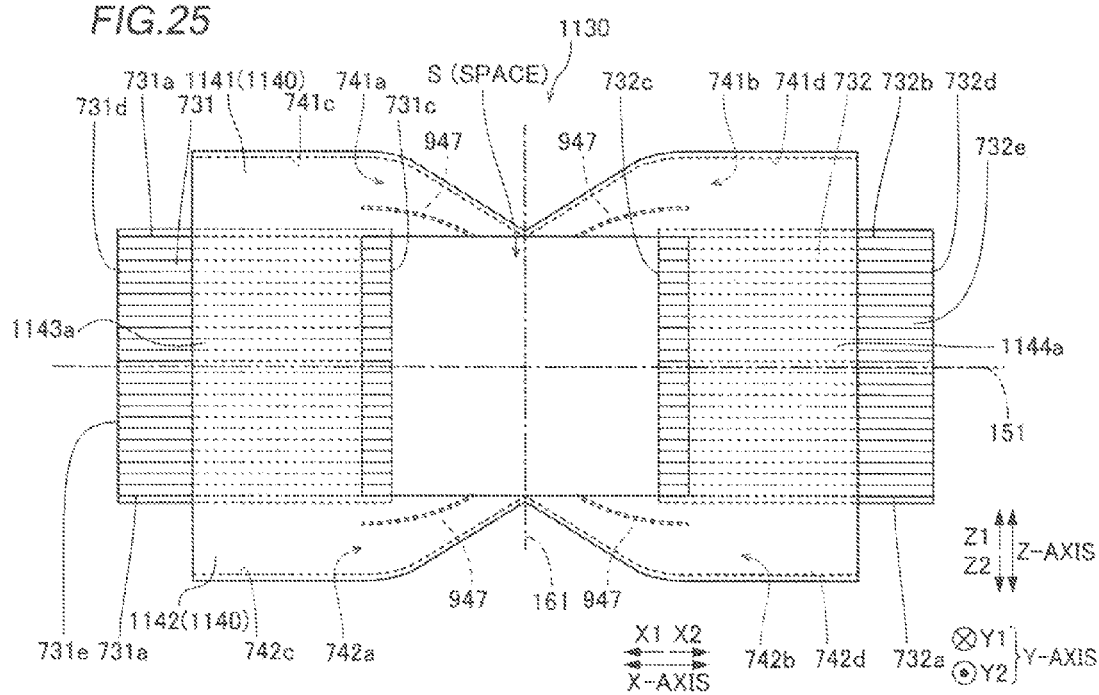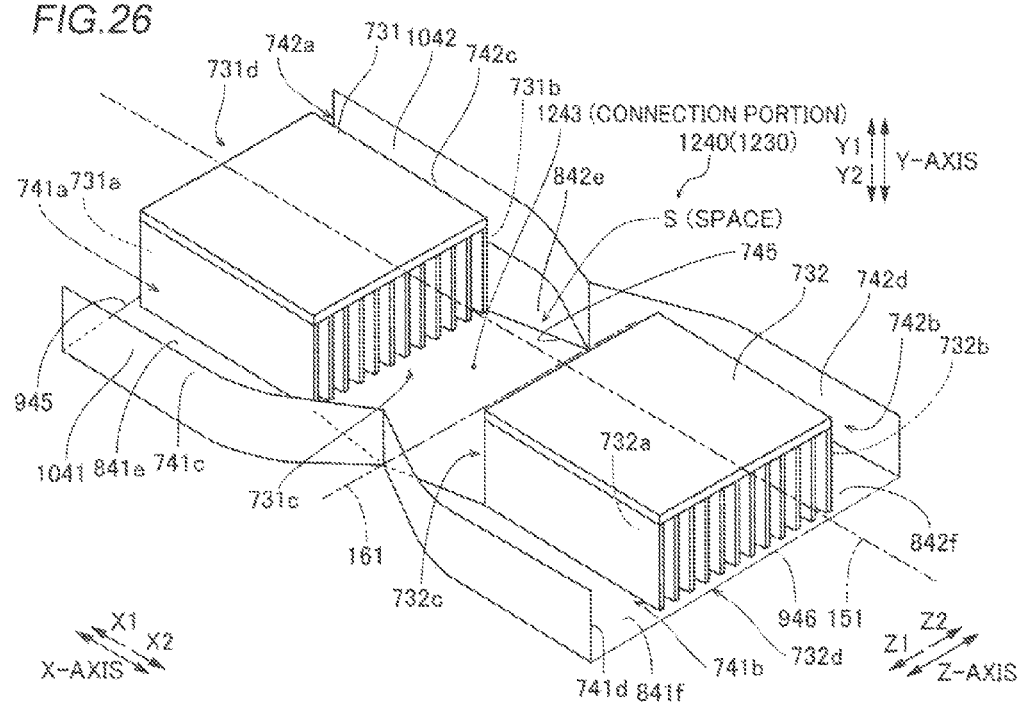

POWER CONVERTER FOR RAILROAD VEHICLE

CROSS-REFERENCE TO RELATED APPLICATION

The priority application number JP2016-081878, Power Converter for Railroad Vehicle, Apr. 15, 2016, Yoshiaki Enami and Yoshihisa Uehara, upon which this patent application is based, is hereby incorporated by reference.

BACKGROUND OF THE INVENTION

Field of the Invention

The present invention relates to a power converter for a railroad vehicle, and more particularly, it relates to a power converter for a railroad vehicle including a plurality of heat radiating fins that radiates the heat of a device mounted on the railroad vehicle when the railroad vehicle is running.

Description of the Background Art

A power converter for a railroad vehicle including a plurality of heat radiating fins that radiates the heat of a device mounted on the railroad vehicle when the railroad vehicle is running is known in general, as disclosed in Japanese Patent No. 3469475.

Japanese Patent No. 3469475 discloses a semiconductor cooling apparatus for a railroad vehicle including a plurality of coolers (heat radiating fins) used in a power converter for vehicle driving placed under the floor of the railroad vehicle. In this semiconductor cooling apparatus for a railroad vehicle described in Japanese Patent No. 3469475, the coolers (heat radiating fins) are aligned in a horizontal direction on a side surface of the power converter in an underfloor space of the vehicle in a state where the coolers are divided into three parts along the running direction of the vehicle. The outsides of these cooler clusters are covered by a protective cover provided with multiple air holes. Inside the protective cover, air guide plates inclined toward the respective coolers are provided. Thus, traveling air associated with vehicle running is taken through the air holes of the protective cover, and is supplied directly or partially to the respective coolers (heat radiating fins) while flowing along the air guide plates.

In the semiconductor cooling apparatus for a railroad vehicle described in Japanese Patent No. 3469475, the traveling air taken through the air holes of the protective cover including the multiple air holes is supplied to the respective coolers (heat radiating fins) through the air guide plates, but not all the traveling air taken into the protective cover may be supplied to the respective coolers due to arrangement relationships between the respective coolers or a complicated airflow state in the protective cover caused by the positions of the mounted air guide plates. Under the circumstances in which some of the air taken into the protective cover is not used for heat exchange with the coolers and is directly discharged externally from the protective cover through the multiple air holes of the protective cover, the traveling air is not sufficiently supplied to (introduced into) the respective coolers, and the radiation performance of the respective coolers cannot be maximized. Thus, the radiation performance of the coolers as a whole is disadvantageously reduced.

SUMMARY OF THE INVENTION

The present invention has been proposed in order to solve the aforementioned problem, and an object of the present invention is to provide a power converter for a railroad vehicle capable of improving the overall cooling performance (radiation performance) of a cooling portion that includes a plurality of heat radiating fins.

A power converter for a railroad vehicle according to an aspect of the present invention includes a first heat radiating fin that is arranged on a first side in a running direction of the railroad vehicle to extend along the running direction and radiates heat of a power converter body mounted on the railroad vehicle, a second heat radiating fin that is arranged at a predetermined interval from the first heat radiating fin on a second side in the running direction to extend along the running direction and radiates the heat of the power converter body, and an air guide duct that takes air from a lateral side of one of the first heat radiating fin and the second heat radiating fin, guides the taken air to a region between the first heat radiating fin and the second heat radiating fin, and then guides the taken air to an end of the other of the first heat radiating fin and the second heat radiating fin in the running direction when the railroad vehicle is running.

As hereinabove described, the power converter for a railroad vehicle according to this aspect of the present invention includes the air guide duct that takes the air from the lateral side of one of the first heat radiating fin and the second heat radiating fin, guides the taken air to the region between the first heat radiating fin and the second heat radiating fin, and then guides the taken air to the end of the other of the first heat radiating fin and the second heat radiating fin in the running direction when the railroad vehicle is running. Thus, when the railroad vehicle in which the first heat radiating fin is located on a forward side (windward side) is running, for example, traveling air taken from the lateral side of the first heat radiating fin through the air guide duct can be directly and reliably supplied to the end of the second heat radiating fin in the running direction through the region between the first heat radiating fin and the second heat radiating fin. More specifically, all the air (traveling air) taken through the air guide duct can be reliably (sufficiently) supplied to the second heat radiating fin on a downstream side, and hence the radiation performance of the second heat radiating fin can be maintained at an equivalent level to the radiation performance of the first heat radiating fin on an upstream side (windward side) without reduction. Consequently, the radiation performance of each of the heat radiating fins (the first heat radiating fin and the second heat radiating fin) can be maximally obtained, and hence the overall cooling performance (radiation performance) of coolers that the railroad vehicle includes can be improved.

In the aforementioned power converter for a railroad vehicle according to this aspect, the air guide duct is preferably provided across the region between the first heat radiating fin and the second heat radiating fin. According to this structure, regardless of the running direction of the railroad vehicle, the air taken from the lateral side of one of the first heat radiating fin and the second heat radiating fin can be reliably guided to the region between the first heat radiating fin and the second heat radiating fin and be reliably supplied to the end of the other of the first heat radiating fin and the second heat radiating fin in the running direction.

In the aforementioned power converter for a railroad vehicle according to this aspect, the air guide duct is preferably provided on opposite side ends of each of the first heat radiating fin and the second heat radiating fin in a direction perpendicular to the running direction, and in a state where air has been taken from opposite lateral sides of one of the first heat radiating fin and the second heat radiating fin and the taken air has been guided toward a central portion in the region through the air guide duct, the air guide duct preferably introduces the air to an end of the other of the first heat radiating fin and the second heat radiating fin in the running direction. According to this structure, the taken air can be reliably accumulated in the region between the first heat radiating fin and the second heat radiating fin by effectively utilizing spaces of the opposite side ends of the first heat radiating fin (second heat radiating fin), and the accumulated air before heat exchange can be efficiently supplied to the end of the second heat radiating fin (first heat radiating fin) in the running direction. Furthermore, air can be taken from the opposite lateral sides of the first heat radiating fin (or the second heat radiating fin), and hence the supply of the air to the end of the second heat radiating fin (or the first heat radiating fin) in the running direction can be uniformized (stabilized). Thus, the radiation performance of the second heat radiating fin (or the first heat radiating fin) can be stably obtained.

In this case, the air guide duct preferably guides the air toward the central portion in the region by bending a side surface of the air guide duct toward the central portion in the region, and introduces the air to the end of the other of the first heat radiating fin and the second heat radiating fin in the running direction. According to this structure, the air (traveling air) taken by effectively utilizing the spaces of the opposite side ends of the first heat radiating fin (second heat radiating fin) can be reliably accumulated in the region between the first heat radiating fin and the second heat radiating fin along the side surface of the air guide duct bent toward the central portion.

In the aforementioned structure in which the air guide duct is provided on the opposite side ends of each of the first heat radiating fin and the second heat radiating fin in the direction perpendicular to the running direction, the air guide duct preferably takes air from the opposite lateral sides, and guides the taken air toward the central portion in the region in a state where the taken air is bent toward the power converter body in a vicinity of the region. According to this structure, fresh outside air (low-temperature air) not subjected to heat exchange in the first heat radiating fin (or the second heat radiating fin) can be guided toward the central portion in the region between the first heat radiating fin and the second heat radiating fin in a state where the low-temperature air passes through a portion closer to the power converter body above high-temperature air heated by heat exchange in the first heat radiating fin (or the second heat radiating fin) in the region. Therefore, the fresh outside air (low-temperature air) can be reliably supplied to the end of the second heat radiating fin (or the first heat radiating fin) in the running direction.

In this case, the air guide duct preferably guides the air toward the central portion in the region in a state where a surface of the air guide duct opposite to the power converter body is bent toward the power converter body in the region to bend the air toward the power converter body in the vicinity of the region. According to this structure, the flow of the low-temperature air (fresh outside air) that is guided toward the central portion in the region between the first heat radiating fin and the second heat radiating fin can be easily formed in the region.

In the aforementioned power converter for a railroad vehicle according to this aspect, the first heat radiating fin and the second heat radiating fin are preferably placed in an underfloor space of the railroad vehicle, and the air guide duct preferably discharges air that has cooled one of the first heat radiating fin and the second heat radiating fin to the region between the first heat radiating fin and the second heat radiating fin, and guides the air taken from the lateral side of one of the first heat radiating fin and the second heat radiating fin to the end of the other of the first heat radiating fin and the second heat radiating fin in the running direction through the region. According to this structure, the high-temperature air heated by heat exchange in the first heat radiating fin (or the second heat radiating fin) can be discharged to the region between the first heat radiating fin and the second heat radiating fin, and the fresh outside air (low-temperature air) not subjected to heat exchange in the first heat radiating fin (or the second heat radiating fin) can be introduced into this region and be reliably supplied to the end of the second heat radiating fin (or the first heat radiating fin) in the running direction. Thus, the "air guide duct" according to the present invention is used, whereby the high-temperature air is replaced by the fresh outside air in the region between the first heat radiating fin and the second heat radiating fin, and the fresh outside air can be directly supplied to the second heat radiating fin (or the first heat radiating fin) on the downstream side, and hence the radiation performance of the first heat radiating fin (or the second heat radiating fin) on the upstream side and the radiation performance of the second heat radiating fin (or the first heat radiating fin) on the downstream side can be maximally obtained and be maintained at the equivalent level to each other.

In the aforementioned structure in which the first heat radiating fin and the second heat radiating fin are placed in the underfloor space of the railroad vehicle, the air guide duct preferably includes an opening that is open outward in the region, and the air guide duct preferably discharges the air that has cooled one of the first heat radiating fin and the second heat radiating fin outward through the opening, and guides the air taken from the lateral side of one of the first heat radiating fin and the second heat radiating fin to the end of the other of the first heat radiating fin and the second heat radiating fin in the running direction through the region. According to this structure, the high-temperature air can be easily discharged outward (to the atmosphere) through the opening, and the fresh outside air (low-temperature air) taken through the air guide duct, by which the high-temperature air to be discharged outward is replaced can be easily guided to the end of the second heat radiating fin (or the first heat radiating fin).

In the aforementioned structure in which the first heat radiating fin and the second heat radiating fin are placed in the underfloor space of the railroad vehicle, the air guide duct preferably extends along a side end of each of the first heat radiating fin and the second heat radiating fin along the running direction in a state where a surface of each of the first heat radiating fin and the second heat radiating fin opposite to the power converter body is at least partially exposed. According to this structure, areas of the first heat radiating fin and the second heat radiating fin exposed outward (to outside air) can be ensured, and hence the radiation performance of the first heat radiating fin and the second heat radiating fin can be maintained even when the traveling air tends to become insufficient due to a reduction in the running speed of the railroad vehicle.

In the aforementioned structure in which the first heat radiating fin and the second heat radiating fin are placed in the underfloor space of the railroad vehicle, the air guide duct preferably covers, from a side opposite to the power converter body, an end of each of the first heat radiating fin and the second heat radiating fin in a direction perpendicular to the running direction, the end that extends along the running direction, and extends along the end in the direction perpendicular to the running direction. According to this structure, a pathway for traveling air can be easily ensured also inside the first heat radiating fin and the second heat radiating fin (grooves between adjacent fins) by covering the end of each of the first heat radiating fin and the second heat radiating fin in the direction perpendicular to the running direction from the side of the air guide duct opposite to the power converter body, and hence the flow of the air along the running direction of the railroad vehicle can be reliably formed in the first heat radiating fin and the second heat radiating fin as compared with the case where the air guide duct does not cover the first heat radiating fin and the second heat radiating fin so that the first heat radiating fin and the second heat radiating fin are exposed (open) outward. Thus, the radiation performance of the second heat radiating fin (or the first heat radiating fin) can be reliably maintained by effectively utilizing the fresh outside air (low-temperature air) supplied through the air guide duct.

In the aforementioned structure in which the first heat radiating fin and the second heat radiating fin are placed in the underfloor space of the railroad vehicle, the air guide duct preferably protrudes to a windward side beyond an end of the first heat radiating fin or the second heat radiating fin on a side from which air is taken when the railroad vehicle is running. According to this structure, a tip end of the air guide duct extends to the windward side beyond the end of the first heat radiating fin or the second heat radiating fin, and hence the traveling air (fresh outside air) can be more reliably taken into the air guide duct.

In the aforementioned structure in which the first heat radiating fin and the second heat radiating fin are placed in the underfloor space of the railroad vehicle, the air guide duct preferably surrounds the region between the first heat radiating fin and the second heat radiating fin, and the air guide duct preferably mixes the air that has cooled one of the first heat radiating fin and the second heat radiating fin and the air taken from the lateral side of one of the first heat radiating fin and the second heat radiating fin and guided to the region, and guides the mixed air to the end of the other of the first heat radiating fin and the second heat radiating fin in the running direction. According to this structure, the amount of air obtained by adding the high-temperature air subjected to heat exchange in the first heat radiating fin (or the second heat radiating fin) and the low-temperature air (fresh outside air) not subjected to heat exchange in the first heat radiating fin (or the second heat radiating fin) in the region between the first heat radiating fin and the second heat radiating fin, surrounded by the air guide duct can be directly supplied to the end of the second heat radiating fin (or the first heat radiating fin). Thus, not only the air (traveling air) that has been taken through the air guide duct but also the air that has passed through the first heat radiating fin (or the second heat radiating fin) on the upstream side can be supplied to the second heat radiating fin (or the first heat radiating fin) on the downstream side, and hence an extreme reduction in the radiation performance of the second heat radiating fin (or the first heat radiating fin) is suppressed even by the mixed air, the temperature of which has been slightly increased above the temperature of the fresh outside air, and the radiation performance can be maintained.

In the aforementioned power converter for a railroad vehicle according to this aspect, the air guide duct is preferably integrally provided from the first heat radiating fin to the second heat radiating fin. According to this structure, the air guide duct to be mounted on the first heat radiating fin and the second heat radiating fin is a unitary monolithic component, and an increase in the number of components in the power converter of a railroad vehicle can be suppressed. Furthermore, the structure around the power converter for a railroad vehicle can be simplified, and hence maintenance can be easily performed.

In the aforementioned structure in which the air guide duct is provided on the opposite side ends of each of the first heat radiating fin and the second heat radiating fin in the direction perpendicular to the running direction, the first heat radiating fin and the second heat radiating fin preferably extend downward of the railroad vehicle, and the air guide duct preferably extends along the running direction on the opposite side ends of each of the first heat radiating fin and the second heat radiating fin in a direction of crossties. According to this structure, a reduction in the radiation performance of an entire plurality of heat radiating fins (entire cooling portion) can be suppressed by efficiently utilizing the traveling air taken from the vicinity of a rail track which is a lower portion of the railroad vehicle along with the running of the railroad vehicle.

In the aforementioned structure in which the air guide duct is provided on the opposite side ends of each of the first heat radiating fin and the second heat radiating fin in the direction perpendicular to the running direction, the first heat radiating fin and the second heat radiating fin preferably extend laterally of the railroad vehicle, and the air guide duct preferably extends along the running direction on the opposite side ends of each of the first heat radiating fin and the second heat radiating fin in a vertical direction. According to this structure, a reduction in the radiation performance of an entire plurality of heat radiating fins (entire cooling portion) can be suppressed by efficiently utilizing the traveling air taken from the lateral side of the railroad vehicle along with the running of the railroad vehicle.

In the aforementioned power converter for a railroad vehicle according to this aspect, the air guide duct preferably has a symmetric shape in the running direction with respect to a centerline along a direction perpendicular to the running direction in the region between the first heat radiating fin and the second heat radiating fin. According to this structure, a variation in radiation amount between the first heat radiating fin and the second heat radiating fin can be similarly suppressed even when the railroad vehicle runs, taking any of the first heat radiating fin side and the second heat radiating fin side as a traveling direction. In other words, regardless of the running direction of the railroad vehicle, the effects of the present invention can be sufficiently obtained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 25 is a side elevational view showing the cooling structure of the power converter according to the modification of the fifth embodiment of the present invention; and FIG. 26 is a perspective view showing the cooling structure of a power converter according to a modification of the sixth embodiment of the present invention.

DESCRIPTION OF THE PREFERRED EMBODIMENTS

Embodiments of the present invention are hereinafter described with reference to the drawings.

[First Embodiment]

The structure of a power converter 100 for a railroad vehicle 10 according to a first embodiment of the present invention is now described with reference to FIGS. 1 to 5. The power converter 100 is an example of the "power converter for a railroad vehicle" in the claims. In the following description, the running direction of the railroad vehicle 10 is set as an X-axis direction, the direction of crossties in a rail track 1 is set as a Y-axis direction, and a vertical direction is set as a Z-axis direction.

Figure 1:
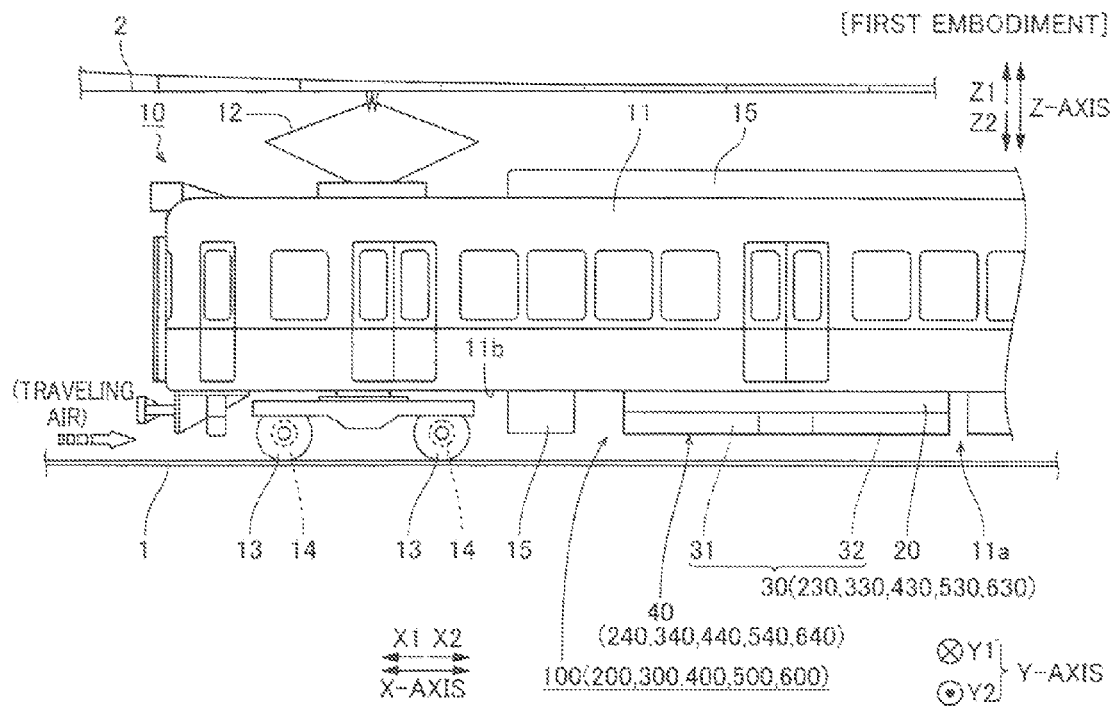
FIG. 1 is a side elevational view showing a railroad vehicle according to a first embodiment of the present invention.
Figure 2:
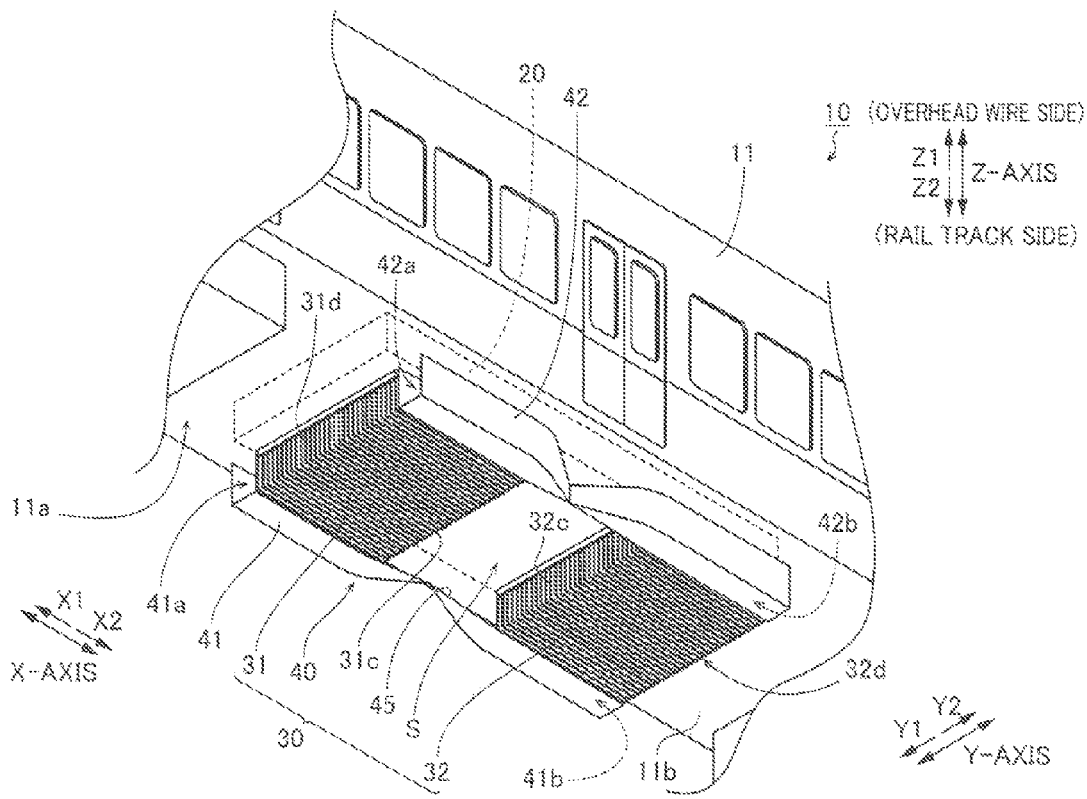
FIG. 2 is a perspective view of the railroad vehicle according to the first embodiment of the present invention, as viewed obliquely from below.

The power converter 100 according to the first embodiment of the present invention is placed in an underfloor space 11a of a vehicle body 11 of the railroad vehicle 10, as shown in FIGS. 1 and 2. The schematic structure of the railroad vehicle 10 is now described briefly. The railroad vehicle 10 includes the vehicle body 11, a pantograph 12 that receives (collects) electric power supplied to an overhead wire 2, induction motors 14 (shown by broken lines) that rotate drive wheels 13 using the electric power from the overhead wire 2, and a plurality of other devices 15 such as an air conditioner and a controller, as shown in FIG. 1. The power converter 100 has a function of converting the electric power from the overhead wire 2 by switching of a semiconductor element (not shown) and controlling rotation of the induction motors 14 when the railroad vehicle 10 is running.

(Structure of Power Converter)

The power converter 100 includes a semiconductor device 20 that performs power conversion and a cooling portion 30 that radiates heat generated from the semiconductor element in the semiconductor device 20 to outside air. As shown in FIG. 2, the power converter 100 is hung on and fixed to the lower surface 11b of the vehicle body 11 in the underfloor space 11a of the vehicle body 11. The semiconductor device 20 is arranged on the lower surface 11b side (Z1 side), and the cooling portion 30 is arranged on the rail track 1 side (Z2 side). The cooling portion 30 includes a heat radiating fin 31 (X1 side) and a heat radiating fin 32 (X2 side) arranged at a predetermined interval along the X-axis direction in which the vehicle body 11 extends. The heat radiating fins 31 and 32 each extend vertically downward (the rail track 1 side) from the lower surface (Z2 side) of the semiconductor device 20 and extend in a thin plate shape along the X-axis direction. The semiconductor device 20 is an example of the "power converter body" in the claims. The heat radiating fins 31 and 32 are examples of the "first heat radiating fin" and the "second heat radiating fin" in the claims, respectively.

When the railroad vehicle 10 is running along arrow X1, as shown in FIG. 1, air in the vicinity of the rail track 1 relatively flows along arrow X2 and blows against the cooling portion 30 in the underfloor space 11a. In this case, traveling air flows along arrow X2 through clearance gaps of the heat radiating fins 31 and 32 (see FIG. 2) that extend in the X-axis direction. Thus, the heat of the cooling portion 30 is discharged to the atmosphere. In the following description, assume that the railroad vehicle 10 is running along arrow X1, the heat radiating fin 31 is arranged on a windward side (X1 side) in the running direction, and the heat radiating fin 32 is arranged on a leeward side (X2 side) in the running direction.

Figure 3:
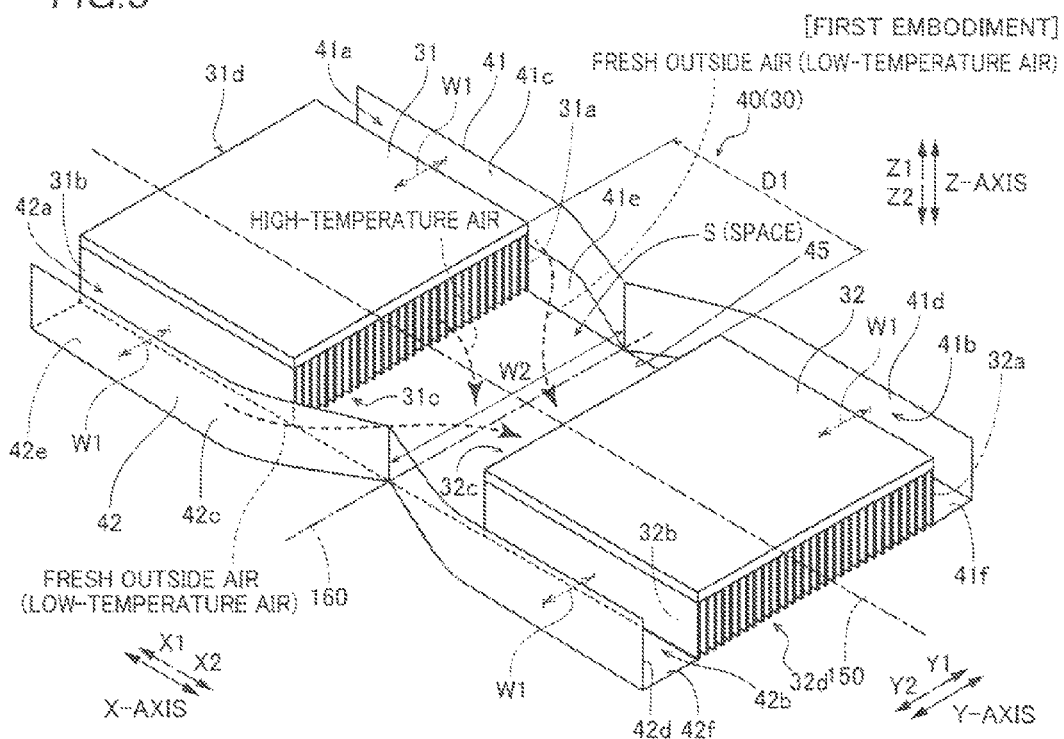
FIG. 3 is a perspective view showing the cooling structure of a power converter according to the first embodiment of the present invention.

According to the first embodiment, an air guide duct 40 is placed on the heat radiating fins 31 and 32, as shown in FIGS. 2 and 3. In FIG. 3, illustration of the semiconductor device 20 (see FIG. 2) mounted on the upper surface (Z1 side) of the cooling portion 30 is omitted in order to show an arrangement relationship between the heat radiating fins 31 and 32 and the air guide duct 40.

(Structure of Air Guide Duct)

Figure 5:
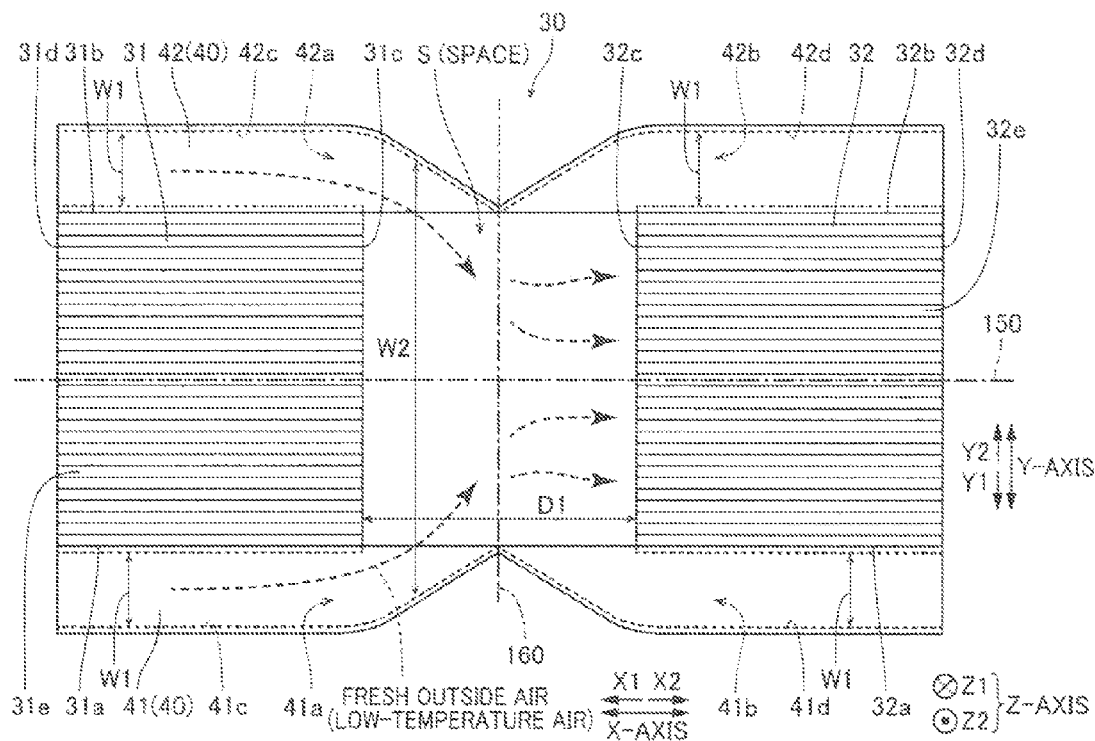
FIG. 5 is a bottom view showing the cooling structure of the power converter according to the first embodiment of the present invention.

The air guide duct 40 includes a duct portion 41 continuously arranged along an outer surface 31a (32a) of the heat radiating fin 31 (32) on one side (Y1 side) along the direction (Y-axis direction) of the crossties and a duct portion 42 continuously arranged along an outer surface 31b (32b) of the heat radiating fin 31 (32) on the other side (Y2 side) along the direction of the crossties, as shown in FIG. 3. The duct portions 41 and 42 are line-symmetric in the direction of the crossties with respect to a centerline 150 (one-dot chain line) of the vehicle body 11 that extends in the X-axis direction, as shown in FIG. 5. In other words, the air guide duct 40 extends along the running direction on both the outer surface 31a (32a) on the Y1 side and the outer surface 31b (32b) on the Y2 side in the direction of the crossties of each of the heat radiating fins 31 and 32. The structure of the duct portion 41 on the Y1 side is described below in detail, and the overall structure of the air guide duct 40 is described below while the structure of the duct portion 42 on the Y2 side is additionally described as needed. The outer surfaces 31a, 31b, 32a, and 32b are examples of the "side end" in the claims.

The duct portion 41 includes a flow path 41a that extends along the outer surface 31a of the heat radiating fin 31 and has a width W1 and a flow path 41b that extends along the outer surface 32a of the heat radiating fin 32 and has a width W1. The duct portion 41 is integrated by connecting the flow path 41a and the flow path 41b to each other in a space S between the heat radiating fin 31 and the heat radiating fin 32. A side surface 41c of the flow path 41a linearly extends from an end 31d of the heat radiating fin 31 on the X1 side to an end 31c of the heat radiating fin 31 on the X2 side along the outer surface 31b, and then is inclined in a horizontal direction (the direction of the crossties: along arrow Y2) toward the centerline 150 at the end 31c on the X2 side. Similarly, a side surface 41d of the flow path 41b linearly extends from an end 32d of the heat radiating fin 32 on the X2 side to an end 32c of the heat radiating fin 32 on the X1 side along the outer surface 32b, and then is inclined in the horizontal direction (the direction of the crossties: along arrow Y1) toward the centerline 150 at the end 32c on the X1 side. An end of the side surface 41c on the X2 side and an end of the side surface 41d on the X1 side are seamlessly connected to each other in the space S. The flow path 41a and the flow path 41b include a bottom surface 41e and a bottom surface 41f that extend in the X-axis direction (horizontal direction), respectively. The widths W1 of the bottom surfaces 41e and 41f in the Y-axis direction (the direction of the crossties) are gradually changed according to the inclined shapes of the side surfaces 41c and 41d in the space S. In this case, the widths W1 of the bottom surfaces 41e and 41f are reduced in a direction toward each other. The length D1 (a separate interval from the end 31c of the heat radiating fin 31 to the end 32c of the heat radiating fin 32) of the space S in the X-axis direction is larger than the width W1 of each of the flow paths 41a and 41b (D1>W1). The space S is an example of the "region between the first heat radiating fin and the second heat radiating fin" in the claims. The ends 31c and 32c are examples of the "end of the other of the first heat radiating fin and the second heat radiating fin in the running direction" in the claims.

The duct portion 42 is configured similarly to the duct portion 41. More specifically, the duct portion 42 is provided along the outer surface 31b of the heat radiating fin 31 and along the outer surface 32b of the heat radiating fin 32. The duct portion 42 includes flow paths 42a and 42b, side surfaces 42c and 42d, and bottom surfaces 42e and 42f. The duct portion 42 is integrated by connecting the flow paths 42a and 42b to each other in the space S between the heat radiating fin 31 and the heat radiating fin 32. Thus, the air guide duct 40 as a whole is integrally provided in the cooling portion 30 from the heat radiating fin 31 to the heat radiating fin 32. In the space S, the width W2 of the air guide duct 40 in the Y-axis direction (a distance between the side surface 41c of the flow path 41a and the side surface 42c of the flow path 42a in the Y-axis direction and a distance between the side surface 41d of the flow path 41b and the side surface 42d of the flow path 42b in the Y-axis direction) is reduced toward a central portion.

Thus, according to the first embodiment, when the air guide duct 40 is provided so that the railroad vehicle 10 (see FIG. 1) is running along arrow X1, air (traveling air) is taken from the duct portions 41 and 42 that serve as the lateral sides of the heat radiating fin 31, and the taken air is guided to the space S between the heat radiating fin 31 and the heat radiating fin 32. The air guided to the space S is guided to the end 32c of the heat radiating fin 32 in the running direction. The air guide duct 40 as a whole has a function of taking the air (traveling air) from the opposite lateral sides of the heat radiating fin 31 on the X1 side and the Y1 side and on the X1 side and the Y2 side, guiding the taken air toward the central portion in the space S through the duct portions 41 and 42 (flow paths 41a and 41b), and then introducing this air guided toward the central portion in the space S to the end 32c of the heat radiating fin 32 in the running direction.

The side surface 41c (41d) of the duct portion 41 is bent toward the central portion (centerline 150) in the vicinity of an entrance to the space S, and the side surface 42c (42d) of the duct portion 42 is bent toward the central portion (centerline 150) in the vicinity of another entrance to the space S. Thus, when the railroad vehicle 10 (see FIG. 1) is running along arrow X1, the air taken from the opposite lateral sides of the heat radiating fin 31 on the X1 side and the Y1 and on the X1 side and the Y2 side is guided toward the central portion (a region in the vicinity of the centerline 150) in the space S through the flow paths 41a and 42a, and is reliably introduced to the end 32c of the heat radiating fin 32.

The air guide duct 40 discharges air that has cooled the heat radiating fin 31 to the space S, and guides the air taken from the lateral sides of the heat radiating fin 31 to the end 32c of the heat radiating fin 32 in the running direction through the space S. Specifically, the air guide duct 40 is formed with an opening 45 that is open outward (to the rail track 1 side) in the space S. The air guide duct 40 discharges the air that has cooled the heat radiating fin 31 outward (the rail track 1 side) through the opening 45, and guides the air taken from the opposite lateral sides (the flow paths 41a and 42a) of a windward portion of the heat radiating fin 31 to the end 32c of the heat radiating fin 32 in the running direction through the space S.

Figure 4:
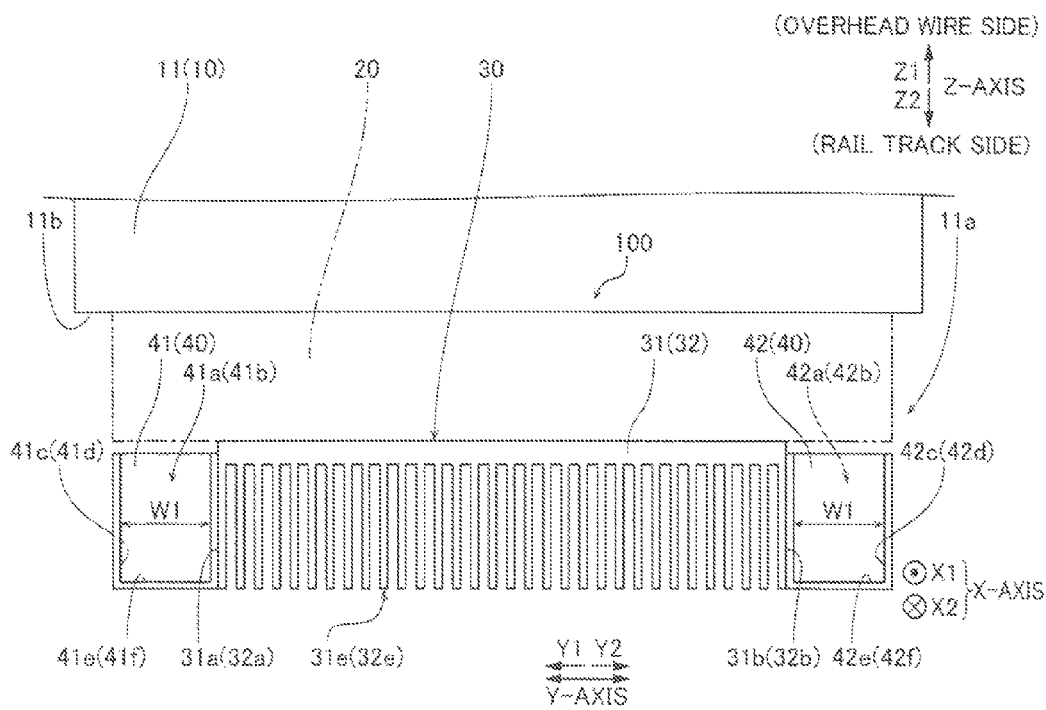
FIG. 4 is a sectional view showing the cooling structure of the power converter according to the first embodiment of the present invention.

According to the first embodiment, the duct portion 41 extends along the outer surface 31a (32a) of each of the heat radiating fins 31 and 32 in the running direction (X-axis direction) in a state where a lower surface region 31e (32e) of each of the heat radiating fins 31 and 32 is exposed downward (to the rail track 1 side) of the railroad vehicle 10, as shown in FIGS. 4 and 5. Similarly, the duct portion 42 extends along the outer surface 31b (32b) of each of the heat radiating fins 31 and 32 in a state where the lower surface region 31e (32e) of each of the heat radiating fins 31 and 32 is exposed downward (to the rail track 1 side) of the railroad vehicle 10.

Thus, when the railroad vehicle 10 is running along arrow X1, the air (traveling air) taken from the lateral sides of the heat radiating fin 31 through the air guide duct 40 (the flow paths 41a and 42a) is directly and reliably (sufficiently) supplied to the end 32c of the heat radiating fin 32 in the running direction through the space S. At this time, air heated by the heat radiating fin 31 is discharged downward (to the rail track 1 side) through the opening 45. Therefore, air (fresh outside air) that has the same temperature condition as the traveling air (fresh outside air) to be supplied to the heat radiating fin 31 can be supplied from the end 32c to the entire heat radiating fin 32, and hence the radiation performance of the heat radiating fin 32 on a downstream side can be maintained at an equivalent level to the radiation performance of the heat radiating fin 31 on an upstream side (windward side).

According to the first embodiment, the air guide duct 40 has a symmetric shape in the running direction with respect to a centerline 160 (one-dot chain line) along the direction of the crossties, which is perpendicular to the running direction (X-axis direction), in the space S, as shown in FIG. 5. Therefore, the airflow in the air guide duct 40 in the case where the railroad vehicle 10 (see FIG. 1) is running along arrow X1 is described above, but the traveling air is taken from the heat radiating fin 32 side in the air guide duct 40, and similarly contributes to suppression of a reduction in the radiation performance of the heat radiating fin 31 on the leeward side in the case where the railroad vehicle 10 is running along arrow X2. The power converter 100 according to the first embodiment is configured in the above manner.

(Effects of First Embodiment)

According to the first embodiment, the following effects can be obtained.

According to the first embodiment, as hereinabove described, the power converter 100 includes the air guide duct 40 that takes the air from the lateral sides of one of the heat radiating fin 31 and the heat radiating fin 32, guides the taken air to the space S between the heat radiating fin 31 and the heat radiating fin 32, and then guides the taken air to the end 32c (31c) of the other of the heat radiating fin 31 and the heat radiating fin 32 in the running direction when the railroad vehicle 10 is running. Thus, when the railroad vehicle 10 in which the heat radiating fin 31 is located on a forward side (windward side) is running, the traveling air taken from the lateral sides of the heat radiating fin 31 through the air guide duct 40 can be directly and reliably supplied to the end 32c of the heat radiating fin 32 in the running direction through the space S between the heat radiating fin 31 and the heat radiating fin 32. More specifically, all the air (traveling air) taken through the air guide duct 40 can be reliably (sufficiently) supplied to the heat radiating fin 32 on the downstream side, and hence the radiation performance of the heat radiating fin 32 on the downstream side can be maintained at the equivalent level to the radiation performance of the heat radiating fin 31 on the upstream side (windward side) without reduction. Consequently, the radiation performance of the heat radiating fins 31 and 32 can be maximally obtained, and hence the overall cooling performance (radiation performance) of the cooling portion 30 that the railroad vehicle 10 includes can be improved.

According to the first embodiment, the air guide duct 40 is provided across the space S between the heat radiating fin 31 and the heat radiating fin 32. Thus, regardless of the running direction of the railroad vehicle 10, the air taken from the lateral sides of one of the heat radiating fin 31 and the heat radiating fin 32 can be reliably guided to the space S and be reliably supplied to the end 32c (31c) of the other of the heat radiating fin 31 and the heat radiating fin 32 in the running direction.

According to the first embodiment, the duct portion 41 that the air guide duct 40 includes is provided on the outer surfaces 31a and 32a of the heat radiating fins 31 and 32 in the direction of the crossties (a direction perpendicular to the running direction), and the duct portion 42 that the air guide duct 40 includes is provided on the outer surfaces 31b and 32b of the heat radiating fins 31 and 32 in the direction of the crossties. In a state where air has been taken from the opposite lateral sides of one of the heat radiating fins 31 and 32 and the taken air has been guided toward the central portion in the space S through the air guide duct 40, the air guide duct 40 introduces this air to the end 32c (31c) of the other of the heat radiating fins 31 and 32 in the running direction. Thus, the taken air (traveling air) can be reliably accumulated in the space S by effectively utilizing the duct portion 41 on the Y1 side of the heat radiating fin 31 (heat radiating fin 32) and the duct portion 42 on the Y2 side of the heat radiating fin 31 (heat radiating fin 32), and the accumulated air before heat exchange can be efficiently supplied to the end 32c (31c) of the heat radiating fin 32 (heat radiating fin 31) in the running direction. Furthermore, air can be taken from the opposite lateral sides of the heat radiating fin 31 (or the heat radiating fin 32), and hence the supply of the air to the end 32c (31c) of the heat radiating fin 32 (or the heat radiating fin 31) can be uniformized (stabilized). Thus, the radiation performance of the heat radiating fin 32 (or the heat radiating fin 31) can be stably obtained.

According to the first embodiment, the air guide duct 40 guides the air toward the central portion in the space S by bending the side surface 41c (41d) of the air guide duct 40 toward the central portion (centerline 150) in the space S, and introduces the air to the end 32c (31c) of the heat radiating fin 32 (or the heat radiating fin 31). Thus, the air (traveling air) taken by more effectively utilizing the duct portion 41 on the Y1 side of the heat radiating fin 31 (heat radiating fin 32) and the duct portion 42 on the Y2 side of the heat radiating fin 31 (heat radiating fin 32) can be reliably accumulated in the space S between the heat radiating fin 31 and the heat radiating fin 32 along the side surface 41c (41d) of the air guide duct 40 bent toward the central portion.

According to the first embodiment, the heat radiating fins 31 and 32 are placed in the underfloor space 11a of the railroad vehicle 10, and the air guide duct 40 discharges the air that has cooled one of the heat radiating fins 31 and 32 to the space S between the heat radiating fin 31 and the heat radiating fin 32, and guides the air taken from the lateral sides of one of the heat radiating fins 31 and 32 to the end 32c (31c) of the other of the heat radiating fins 31 and 32 in the running direction through the space S. Thus, the high-temperature air heated by heat exchange in the heat radiating fin 31 (or the heat radiating fin 32) can be discharged to the space S between the heat radiating fin 31 and the heat radiating fin 32, and the fresh outside air (low-temperature air) not subjected to heat exchange in the heat radiating fin 31 (or the heat radiating fin 32) can be introduced into this space S and be reliably supplied to the end 32c (or the end 31c) of the heat radiating fin 32 (or the heat radiating fin 31). Thus, the air guide duct 40 is used, whereby the high-temperature air is replaced by the fresh outside air in the space S, and the fresh outside air can be directly supplied to the heat radiating fin 32 (or the heat radiating fin 31) on the downstream side, and hence the radiation performance of the heat radiating fin 31 (or the heat radiating fin 32) on the upstream side and the radiation performance of the heat radiating fin 32 (or the heat radiating fin 31) on the downstream side can be maximally obtained and be maintained at the equivalent level to each other.

According to the first embodiment, the opening 45 that is open outward in the space S is provided in the air guide duct 40, and the air guide duct 40 discharges the air that has cooled one of the heat radiating fins 31 and 32 outward through the opening 45, and guides the air taken from the lateral sides of one of the heat radiating fins 31 and 32 to the end 32c (31c) of the other of the heat radiating fins 31 and 32 in the running direction through the space S. Thus, the high-temperature air can be easily discharged outward (to the atmosphere) through the opening 45, and the fresh outside air (low-temperature air) taken through the air guide duct 40, by which the high-temperature air to be discharged outward is replaced can be easily guided to the end 32c (or the end 31c) of the heat radiating fin 32 (or the heat radiating fin 31).

According to the first embodiment, the air guide duct 40 extends along the outer surface 31a (31b, 32a, 32b) of each of the heat radiating fins 31 and 32 along the running direction in a state where the entire lower surface region 31e (32e) (a surface opposite to the semiconductor device 20) of each of the heat radiating fins 31 and 32 is exposed downward of the railroad vehicle 10. Thus, areas of the heat radiating fins 31 and 32 exposed outward (to outside air) can be ensured, and hence the radiation performance of the heat radiating fins 31 and 32 can be maintained even when the traveling air tends to become insufficient due to a reduction in the running speed of the railroad vehicle 10.

According to the first embodiment, the air guide duct 40 is integrally provided from the heat radiating fin 31 to the heat radiating fin 32. Thus, the air guide duct 40 to be mounted on the heat radiating fins 31 and 32 is a unitary monolithic component, and an increase in the number of components in the power converter 100 can be suppressed. Furthermore, the structure around the power converter 100 can be simplified, and hence maintenance can be easily performed.

According to the first embodiment, the heat radiating fins 31 and 32 extend downward (to the rail track 1 side) of the railroad vehicle 10, and the air guide duct 40 extends in the running direction on the outer surface 31a (32a) of each of the heat radiating fins 31 and 32. Thus, a reduction in the overall radiation performance of the cooling portion 30 (heat radiating fins 31 and 32) can be suppressed by efficiently utilizing the traveling air taken from the vicinity of the rail track 1 which is a lower portion of the railroad vehicle 10 along with the running of the railroad vehicle 10.

According to the first embodiment, the air guide duct 40 has the symmetric shape in the running direction with respect to the centerline 160 along the direction of the crossties, which is perpendicular to the running direction, in the space S. Thus, a variation in radiation amount between the heat radiating fins 31 and 32 can be similarly suppressed even when the railroad vehicle 10 runs, taking any of the heat radiating fin 31 side (X1 side) and the heat radiating fin 32 side (X2 side) as a traveling direction. In other words, regardless of the running direction of the railroad vehicle 10, the effects of the first embodiment can be sufficiently obtained.

[Second Embodiment]

A second embodiment is now described with reference to FIGS. 1, 6, and 7. In this second embodiment, the bottom surface shape of an air guide duct 240 in a space S is different from that in the aforementioned first embodiment. In the figures, structures of the second embodiment similar to those of the aforementioned first embodiment are denoted by the same reference signs.

Figure 6:
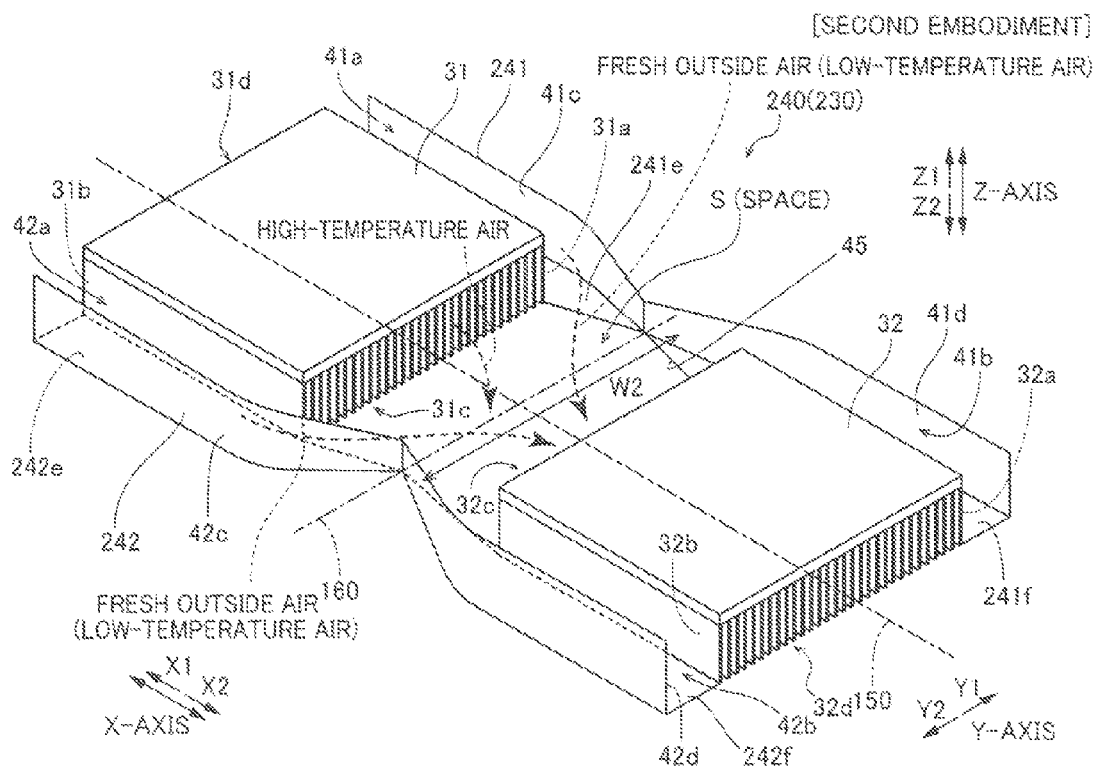
FIG. 6 is a perspective view showing the cooling structure of a power converter according to a second embodiment of the present invention.

A power converter 200 (see FIG. 1) according to the second embodiment of the present invention includes a cooling portion 230, as shown in FIG. 6. The air guide duct 240 is placed on a set of heat radiating fins 31 and 32 of the cooling portion 230.

Figure 7:
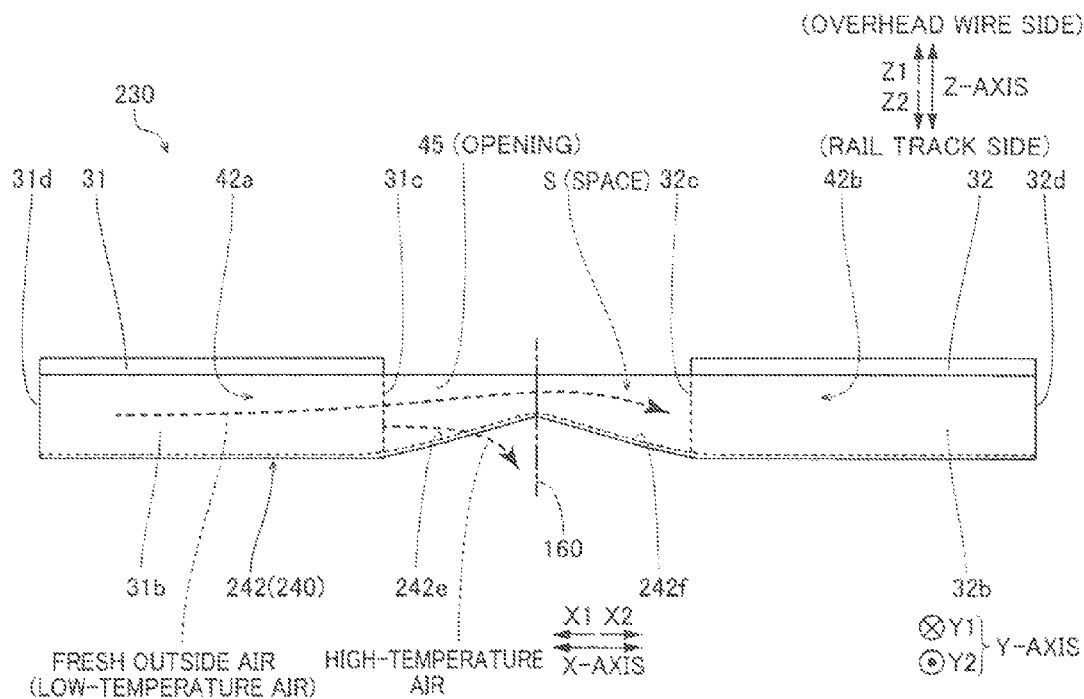
FIG. 7 is a side elevational view showing the cooling structure of the power converter according to the second embodiment of the present invention.

According to the second embodiment, the air guide duct 240 takes air from the opposite lateral sides of a windward portion of the heat radiating fin 31 or 32, and guides the taken air toward a central portion in the space S in a state where the taken air is bent obliquely upward (along arrow Z1, toward a semiconductor device 20) in the vicinity of the space S, as shown in FIGS. 6 and 7. Specifically, in a duct portion 241 on a Y1 side that the air guide duct 240 includes, the bottom surface 241e thereof at a position corresponding to the space S is bent obliquely upward and extends, as shown in FIG. 6. The bottom surface 241f thereof having a symmetric shape with respect to a centerline 160 is also bent obliquely upward at a position corresponding to the space S and extends. Similarly, in a duct portion 242 on a Y2 side that the air guide duct 240 includes, the bottom surfaces 242e and 242f thereof at positions corresponding to the space S are bent obliquely upward and extend in a state where the same have symmetric shapes to each other with respect to the centerline 160, as shown in FIG. 7. In this case, the positions of the bottom surfaces 242e and 242f (bottom surfaces 241e and 241f (see FIG. 6)) in a Z-axis direction are gradually raised in a direction toward each other.

Thus, as shown in FIG. 6, the air guide duct 240 guides the air toward the central portion in the space S in a state where the bottom surfaces 241e and 241f (bottom surfaces 242e and 242f) of the air guide duct 240 are bent obliquely upward in the space S such that the air is bent obliquely upward (along arrow Z1) in the vicinity of an entrance of the space S. Therefore, when a railroad vehicle 10 (see FIG. 1) is running along arrow X1, fresh outside air (low-temperature air) not subjected to heat exchange in the heat radiating fin 31 can be guided toward the central portion in the space S while passing through an upper portion above high-temperature air heated by heat exchange in the heat radiating fin 31 in the space S. The high-temperature air subjected to heat exchange in the heat radiating fin 31 is pushed downward (along arrow Z2) by the weight of the low-temperature air that passes through the upper portion, and is discharged outward (to the rail track 1 side) through the opening 45 provided in the space S. Consequently, the fresh outside air (low-temperature air) not subjected to heat exchange in the heat radiating fin 31 is efficiently accumulated in the space S and is reliably supplied to an end 32c of the heat radiating fin 32.

When the railroad vehicle 10 is running along arrow X2, traveling air is taken from the heat radiating fin 32 side (X2 side) in the air guide duct 240, and similarly contributes to suppression of a reduction in the radiation performance of the heat radiating fin 31 on a leeward side. The remaining structures of the power converter 200 according to the second embodiment are similar to those of the power converter 100 according to the aforementioned first embodiment.

(Effects of Second Embodiment)

According to the second embodiment, as hereinabove described, the air guide duct 240 takes air from the opposite lateral sides of the windward portion of the heat radiating fin 31 or 32, and guides the taken air toward the central portion in the space S in a state where the taken air is bent upward (toward the semiconductor device 20) in the vicinity of the space S. Thus, the fresh outside air (low-temperature air) not subjected to heat exchange in the heat radiating fin 31 (or the heat radiating fin 32) can be guided toward the central portion (a region in the vicinity of a centerline 150) in the space S in a state where the low-temperature air passes through an upper portion above high-temperature air heated by heat exchange in the heat radiating fin 31 (or the heat radiating fin 32) in the space S. Therefore, this fresh outside air (low-temperature air) can be reliably supplied to the end 32c (or an end 31c) of the heat radiating fin 32 (or the heat radiating fin 31) while marked guiding of the high-temperature air to the end 32c (or the end 31c) of the heat radiating fin 32 (or the heat radiating fin 31) is suppressed by the weight of the low-temperature air (fresh outside air) having a relatively large density.

According to the second embodiment, the air guide duct 240 guides the air toward the central portion in the space S in a state where the bottom surfaces 241e and 241f (bottom surfaces 242e and 242f) are bent upward in the space S to bend the air upward in the vicinity of the space S. Thus, the flow of the low-temperature air (fresh outside air) that passes through the upper portion above the high-temperature air and is guided toward the central portion (the region in the vicinity of the centerline 150) in the space S can be easily formed in the space S between the heat radiating fin 31 and the heat radiating fin 32. The remaining effects of the power converter 200 according to the second embodiment are similar to those of the power converter 100 according to the aforementioned first embodiment.

[Third Embodiment]

A third embodiment is now described with reference to FIGS. 1, 8, and 9. In this third embodiment, an air guide duct 340 covers lower surface regions 31e and 32e of heat radiating fins 31 and 32. In the figures, structures of the third embodiment similar to those of the aforementioned second embodiment are denoted by the same reference signs.

Figure 8:
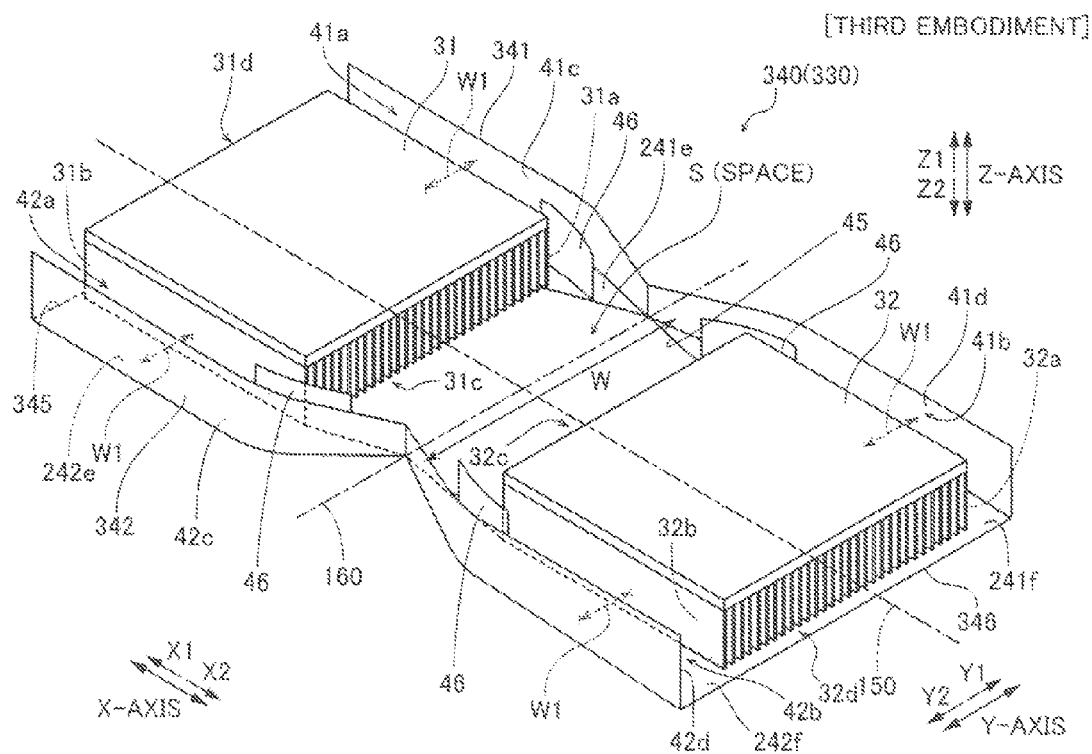
FIG. 8 is a perspective view showing the cooling structure of a power converter according to a third embodiment of the present invention.

A power converter 300 (see FIG. 1) according to the third embodiment of the present invention includes a cooling portion 330, as shown in FIG. 8. The air guide duct 340 is placed on a set of the heat radiating fins 31 and 32 of the cooling portion 330.

Figure 9:
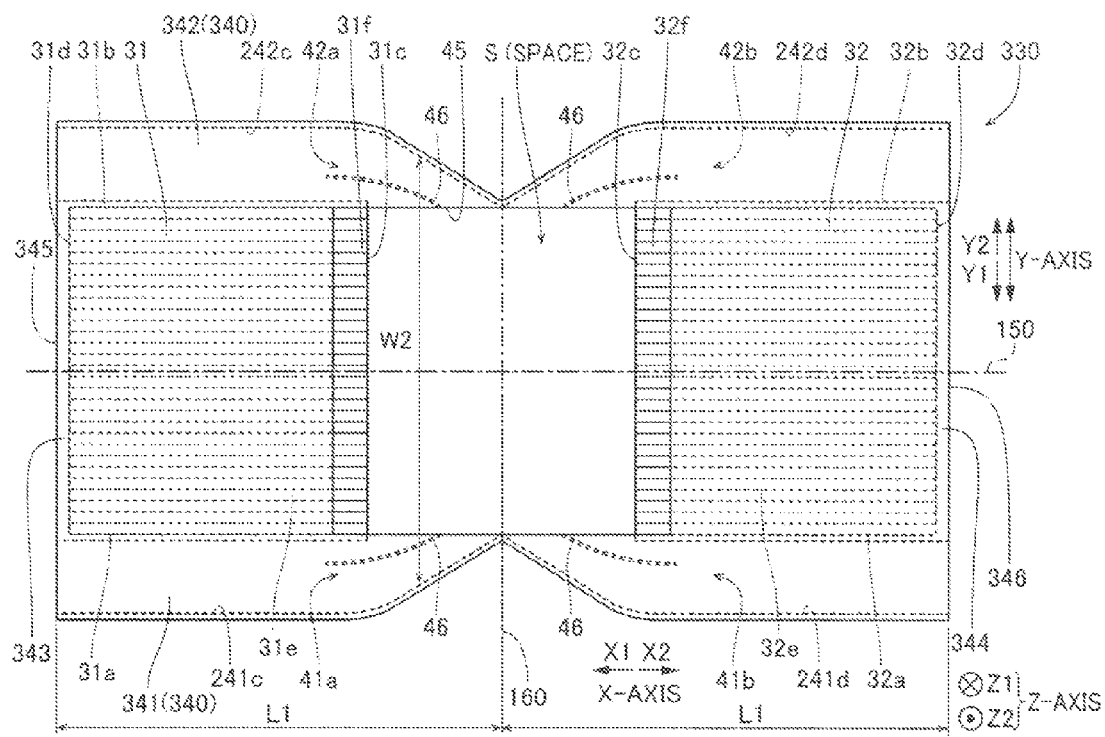
FIG. 9 is a bottom view showing the cooling structure of the power converter according to the third embodiment of the present invention.

According to the third embodiment, the air guide duct 340 includes duct portions 341 and 342 and flat plate-shaped connection portions 343 and 344 that connect the duct portions 341 and 342 to each other, as shown in FIG. 9. In other words, the connection portion 343 of the air guide duct 340 covers a plurality of lower ends 31f of the heat radiating fin 31 that extends along a running direction from below, and extends along the lower ends 31f. The connection portion 344 covers a plurality of lower ends 32f of the heat radiating fin 32 that extends along the running direction from below, and extends along the lower ends 32f. The connection portions 343 and 344 do not cover the entire lower surface regions 31e and 32e, but cover the remaining region in a state where portions of the lower ends 31f in the vicinity of an end 31c of the heat radiating fin 31 and portions of the lower ends 32f in the vicinity of an end 32c of the heat radiating fin 32 are exposed downward (to the rail track 1 side). The air guide duct 340 includes a tip end 345 (346) that protrudes to a windward side beyond an end 31d (32d) of the heat radiating fin 31 (32) on a side from which air is taken when a railroad vehicle 10 (see FIG. 1) is running.

According to the third embodiment, air direction plates 46 are provided in portions of the duct portions 341 and 342 at positions corresponding to a space S. In this case, the air guide duct 340 is provided with a total of four air direction plates 46. Each of the air direction plates 46 is bent toward a centerline 150 along the bent shape of a side surface 41c (41d, 42c, 42d) that translates at a predetermined interval outside each of the air direction plates 46. Thus, when the railroad vehicle 10 (see FIG. 1) is running along arrow X1, air (traveling air) is taken through flow paths 41a and 42a from the opposite lateral sides of the heat radiating fin 31, and the taken air can be more reliably guided to the space S. In FIGS. 8 and 9, illustration of the flows of air that flows through the heat radiating fin 31 and the air guide duct 340 is omitted, but the flows of the air are substantially the same as the flows of the air in the aforementioned second embodiment (see FIGS. 6 and 7). The remaining structures of the power converter 300 according to the third embodiment are similar to those of the power converter 200 according to the aforementioned second embodiment.

(Effects of Third Embodiment)

According to the third embodiment, as hereinabove described, the air guide duct 340 is provided with the connection portions 343 and 344 that cover the lower ends 31f and 32f (ends in a direction perpendicular to the running direction) of the heat radiating fins 31 and 32 extending along the running direction from below (a side opposite to a semiconductor device 20) and extend along the lower ends 31f and 32f. Thus, a pathway for traveling air can be easily ensured also inside the heat radiating fins 31 and 32 by covering the lower ends 31f and 32f of the heat radiating fins 31 and 32 by the connection portions 343 and 344 of the air guide duct 340, and hence the flow of the air along the running direction of the railroad vehicle 10 can be reliably formed in the heat radiating fins 31 and 32 as compared with the case where the air guide duct 340 does not cover the heat radiating fins 31 and 32 so that the heat radiating fins 31 and 32 are exposed (open) outward. Thus, the radiation performance of the heat radiating fin 32 (or the heat radiating fin 31) can be reliably maintained by effectively utilizing fresh outside air (low-temperature air) supplied through the air guide duct 340 (duct portions 341 and 342).

According to the third embodiment, the air guide duct 340 is provided with the tip end 345 (346) that protrudes to the windward side beyond the end 31d (32d) of the heat radiating fin 31 (32) on the side from which air is taken when the railroad vehicle 10 is running. Thus, the tip ends 345 and 346 of the air guide duct 340 extend to the windward side beyond the ends 31d and 32d of the heat radiating fins 31 and 32, and hence traveling air (fresh outside air) can be more reliably taken into the air guide duct 340 (duct portions 341 and 342). The remaining effects of the power converter 300 according to the third embodiment are similar to those of the power converter 100 according to the aforementioned first embodiment.

[Fourth Embodiment]

A fourth embodiment is now described with reference to FIGS. 1, 8, and 10. In this fourth embodiment, the horizontal width (in the direction of crossties) of an air guide duct 440 is wider (larger) than that of the air guide duct 340 (see FIG. 8) according to the aforementioned third embodiment. In the figures, structures of the fourth embodiment similar to those of the aforementioned third embodiment are denoted by the same reference signs.

Figure 10:
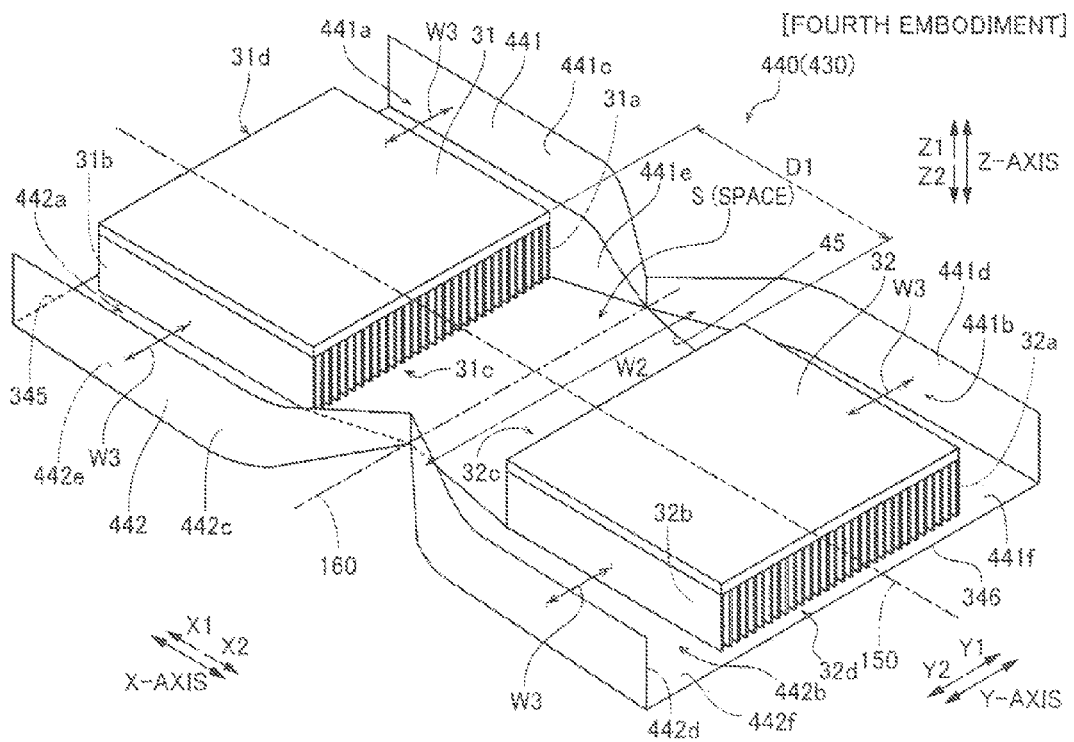
FIG. 10 is a perspective view showing the cooling structure of a power converter according to a fourth embodiment of the present invention.

A power converter 400 (see FIG. 1) according to the fourth embodiment of the present invention includes a cooling portion 430, as shown in FIG. 10. The air guide duct 440 is placed on a set of heat radiating fins 31 and 32 of the cooling portion 430.

According to the fourth embodiment, the width W3 of each of duct portions 441 and 442 in the direction of the crossties (Y-axis direction) is larger than the width W1 (see FIG. 8) of each of the duct portions 341 and 342 according to the aforementioned third embodiment in the direction of the crossties (W3>W1). In other words, the duct portion 441 includes flow paths 441a and 441b each having a horizontal width (width W3) larger than the width W1 of each of the flow paths 41a and 41b (see FIG. 8), and the duct portion 442 includes flow paths 442a and 442b each having a horizontal width (width W3) larger than the width W1 of each of the flow paths 42a and 42b (see FIG. 8). The open area of an opening 45 according to the fourth embodiment is equal to that of the air guide duct 340 according to the aforementioned third embodiment. Thus, respective side surfaces 441c and 441d of the flow paths 441a and 441b are inclined at larger inclination angles from the vicinity of an entrance of a space S toward a centerline 150, and respective side surfaces 442c and 442d of the flow paths 442a and 442b are inclined at larger inclination angles from the vicinity of the entrance of the space S toward the centerline 150. Therefore, bottom surfaces 441e and 441f (bottom surfaces 442e and 442f) reach a centerline 160 while reducing their widths from the vicinity of the entrance of the space S by a greater amount. The air guide duct 440 is provided with no air direction plate 46 (four plates) provided in the aforementioned third embodiment. Instead, the air guide duct 440 includes tip ends 345 and 346 that protrude to a windward side beyond respective ends 31d and 32d of the heat radiating fins 31 and 32.

Thus, the air guide duct 440 can increase the amount of air (traveling air) taken from the opposite lateral sides (the flow paths 441a and 442a or the flow paths 441b and 442b) of a windward portion of the heat radiating fin 31 or 32. In FIG. 10, illustration of the flows of air that flows through the heat radiating fin 31 and the air guide duct 440 is omitted, but the flows of the air are substantially the same as the flows of the air in the aforementioned second embodiment (see FIGS. 6 and 7). The remaining structures of the power converter 400 according to the fourth embodiment are similar to those of the power converter 300 according to the aforementioned third embodiment.

(Effects of Fourth Embodiment)

According to the fourth embodiment, as hereinabove described, the width W3 of each of the duct portions 441 and 442 is larger than the width W1 of each of the duct portions 341 and 342 according to the aforementioned third embodiment. Thus, even when the traveling air tends to become insufficient during running of a railroad vehicle 10 that runs at a relatively low speed, a larger amount of air introduced into the space S can be ensured, and hence the radiation performance of the heat radiating fins 31 and 32 can be maintained. The remaining effects of the power converter 400 according to the fourth embodiment are similar to those of the power converter 300 according to the aforementioned third embodiment.

[Fifth Embodiment]

A fifth embodiment is now described with reference to FIGS. 1, 9, 11, and 12. In this fifth embodiment, the length L2 of an air guide duct 540 in an X-axis direction is shorter than that of the air guide duct 340 (see FIG. 9) according to the aforementioned third embodiment. In the figures, structures of the fifth embodiment similar to those of the aforementioned third embodiment are denoted by the same reference signs.

Figure 11:
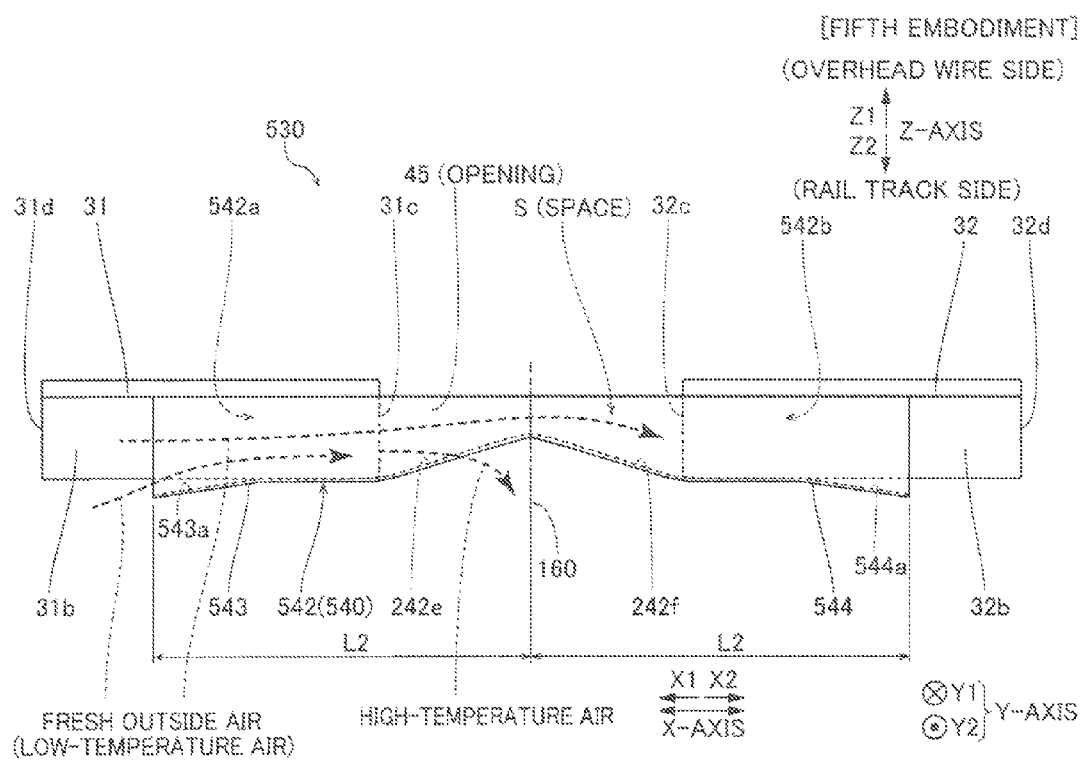
FIG. 11 is a side elevational view showing the cooling structure of a power converter according to a fifth embodiment of the present invention.
Figure 12:
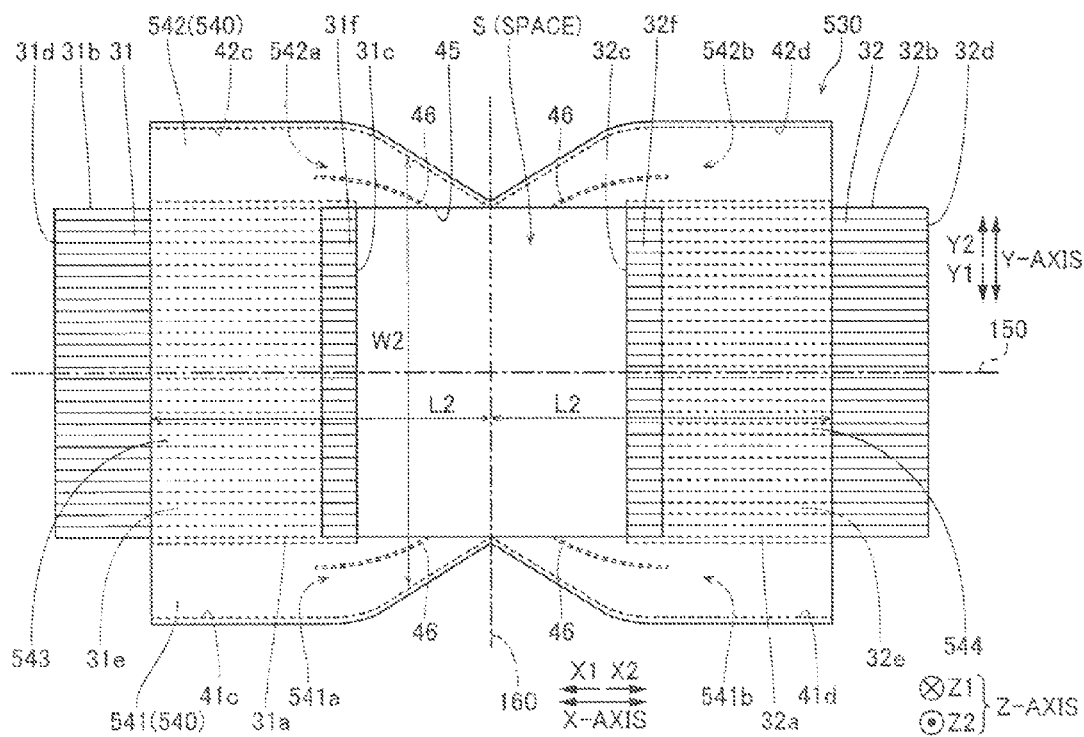
FIG. 12 is a bottom view showing the cooling structure of the power converter according to the fifth embodiment of the present invention.

A power converter 500 (see FIG. 1) according to the fifth embodiment of the present invention includes a cooling portion 530, as shown in FIGS. 11 and 12. The air guide duct 540 is placed on a set of heat radiating fins 31 and 32 of the cooling portion 530.

According to the fifth embodiment, the length L2 in the X-axis direction of each of duct portions 541 and 542 that the air guide duct 540 includes is smaller than the length L1 (see FIG. 9) of each of the duct portions 341 and 342 (see FIG. 9) according to the aforementioned third embodiment (L2<L1). In other words, the length of each of flow paths 541a and 541b (542a and 542b) is smaller than the length of each of the flow paths 41a and 41b (42a and 42b) according to the aforementioned third embodiment. An end 31d of the heat radiating fin 31 that corresponds to a windward side is exposed to the windward side (traveling direction side) beyond a connection portion 543 that connects the duct portion 541 to the duct portion 542, and an end 32d of the heat radiating fin 32 that corresponds to the windward side is exposed to the windward side (traveling direction side) beyond a connection portion 544 that connects the duct portion 541 to the duct portion 542.

As shown in FIG. 11, the connection portion 543 that partially covers a lower surface region 31e of the heat radiating fin 31 includes a bottom surface 543a having a gradually rising slope from the windward side (X1 side) toward a leeward side (X2 side). In contrast, the connection portion 544 that partially covers a lower surface region 32e of the heat radiating fin 32 includes a bottom surface 544a having a gradually rising slope from the windward side (X2 side) toward the leeward side (X1 side). An opening 45 is formed between the connection portion 543 and the connection portion 544. The connection portions 543 and 544 do not cover the entire lower surface regions 31e and 32e, but cover the remaining region in a state where portions of lower ends 31f in the vicinity of an end 31c of the heat radiating fin 31 and portions of lower ends 32f in the vicinity of an end 32c of the heat radiating fin 32 are exposed downward (to the rail track 1 side).

Thus, when a railroad vehicle 10 is running along arrow X1, traveling air (cool air) from obliquely below is easily supplied to the lower surface region 31e (32e) of the heat radiating fin 31, and this traveling air (cool air) is easily taken from the duct portion 541 (flow path 41a) and the duct portion 542 (flow path 42a) that serve as the opposite lateral sides of a windward portion of the heat radiating fin 31. The remaining structures of the power converter 500 according to the fifth embodiment are similar to those of the power converter 300 according to the aforementioned third embodiment.

(Effects of Fifth Embodiment)

According to the fifth embodiment, as hereinabove described, the length L2 in the X-axis direction of each of the duct portions 541 and 542 that the air guide duct 540 includes is smaller than the length L1 (see FIG. 9) of each of the duct portions 341 and 342 (see FIG. 9) according to the aforementioned third embodiment. Thus, when the railroad vehicle 10 is running, the cool traveling air from obliquely below is easily supplied to the lower surface region 31e (32e) of the heat radiating fin 31 (32), and this traveling air can be more easily taken from the duct portion 541 (flow path 41a) and the duct portion 542 (flow path 42a) that serve as the opposite lateral sides of the windward portion of the heat radiating fin 31 (32). More specifically, a flow path for traveling air is ensured in the lower surface region 31e (32e) covered by the connection portion 543 (544) while the lower surface region 31e (32e) of the heat radiating fin 31 (32) is partially exposed to the rail track 1 side, so that the radiation performance of the heat radiating fin 31 (or the heat radiating fin 32) on the windward side can be improved. In addition to this, a reduction in the radiation performance of the heat radiating fin 32 (or the heat radiating fin 31) on the leeward side can be efficiently suppressed. The remaining effects of the power converter 500 according to the fifth embodiment are similar to those of the power converter 300 according to the aforementioned third embodiment.

[Sixth Embodiment]

A sixth embodiment is now described with reference to FIGS. 1, 3, and 13. In this sixth embodiment, no opening 45 (see FIG. 3) is provided in an air guide duct 640. In the figures, structures of the sixth embodiment similar to those of the aforementioned fourth embodiment are denoted by the same reference signs.

Figure 13:
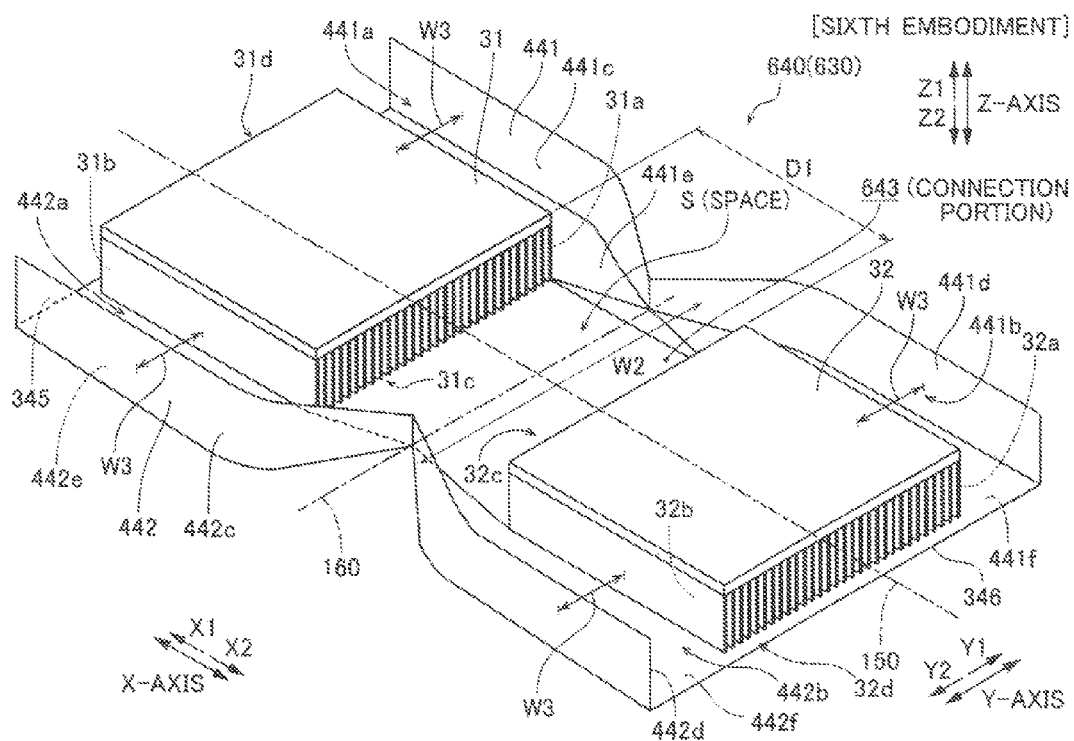
FIG. 13 is a perspective view showing the cooling structure of a power converter according to a sixth embodiment of the present invention.

A power converter 600 (see FIG. 1) according to the sixth embodiment of the present invention includes a cooling portion 630, as shown in FIG. 13. The air guide duct 640 is placed on a set of heat radiating fins 31 and 32 of the cooling portion 630.

According to the sixth embodiment, the air guide duct 640 surrounds a space S between the heat radiating fins 31 and 32. More specifically, the air guide duct 640 includes duct portions 441 and 442 and a flat plate-shaped connection portion 643 that connects the duct portion 441 to the duct portion 442 to each other. The connection portion 643 completely covers respective lower ends 31f and 32f of the heat radiating fins 31 and 32 that extend along a running direction from below, and extends along the lower ends 31f and 32f. The connection portion 643 covers not only the heat radiating fins 31 and 32 but also the space S from below. In other words, no opening 45 as in the aforementioned first embodiment is provided in the air guide duct 640.

Thus, according to the sixth embodiment, the air guide duct 640 mixes air that has cooled one of the heat radiating fins 31 and 32 and air taken from the lateral sides of one of the heat radiating fins 31 and 32 and guided to the space S, and guides the mixed air to an end 32c (31c) of the other of the heat radiating fins 31 and 32 in the running direction. More specifically, the amount of air obtained by adding high-temperature air subjected to heat exchange in the heat radiating fin 31 (or the heat radiating fin 32) and low-temperature air not subjected to heat exchange in the heat radiating fin 31 (or the heat radiating fin 32) in the space S between the heat radiating fin 31 and the heat radiating fin 32, surrounded by the air guide duct 640 is directly supplied to the heat radiating fin 32 (or the heat radiating fin 31). In FIG. 13, illustration of the flows of air that flows through the heat radiating fin 31 and the air guide duct 640 is omitted, but the flows of the air join together in the space S having a lower surface covered by the connection portion 643, and the air is supplied to the end 32c of the heat radiating fin 32.

The sectional area of the end 31c of the heat radiating fin 31 along a Y-Z plane is equal to the sectional area of the end 32c of the heat radiating fin 32 along the Y-Z plane. Therefore, the air that has joined together in the space S and increased in amount flow from the end 32c having the same sectional area as the end 31c into the heat radiating fin 32, and hence the flow speed is increased. The remaining structures of the power converter 600 according to the sixth embodiment are similar to those of the power converter 400 according to the aforementioned fourth embodiment.

(Effects of Sixth Embodiment)

According to the sixth embodiment, as hereinabove described, the connection portion 643 that surrounds the space S between the heat radiating fin 31 and the heat radiating fin 32 is provided in the air guide duct 640. Furthermore, the air guide duct 640 mixes the air that has cooled one of the heat radiating fins 31 and 32 and the air taken from the lateral sides of one of the heat radiating fins 31 and 32 and guided to the space S, and guides the mixed air to the end 32c (31c) of the other of the heat radiating fins 31 and 32 in the running direction. Thus, the amount of air obtained by adding the high-temperature air subjected to heat exchange in the heat radiating fin 31 (or the heat radiating fin 32) and the low-temperature air (fresh outside air) not subjected to heat exchange in the heat radiating fin 31 (or the heat radiating fin 32) in the space S between the heat radiating fin 31 and the heat radiating fin 32, surrounded by the air guide duct 640 can be directly supplied to the end 32c (or the end 31c) of the heat radiating fin 32 (or the heat radiating fin 31). Thus, not only the air (traveling air) that has been taken through the air guide duct 640 but also the air that has passed through the heat radiating fin 31 (or the heat radiating fin 32) on an upstream side can be supplied to the heat radiating fin 32 (or the heat radiating fin 31) on a downstream side, and hence an extreme reduction in the radiation performance of the heat radiating fin 32 (or the heat radiating fin 31) is suppressed even by the mixed air, the temperature of which has been slightly increased above the temperature of the fresh outside air, and the radiation performance can be maintained.

According to the sixth embodiment, in the space S, the sectional area of the end 31c of the heat radiating fin 31 along the Y-Z plane is equal to the sectional area of the end 32c of the heat radiating fin 32 along the Y-Z plane. Thus, in a state where the flow speed of the air that has joined together in the space S and increased in amount is increased, the air can pass through the heat radiating fin 32 (or the heat radiating fin 31), and hence an extreme reduction in the radiation performance of the heat radiating fin 32 (or the heat radiating fin 31) can be easily suppressed even by the mixed air, the temperature of which has been slightly increased above the temperature of the fresh outside air. The remaining effects of the power converter 600 according to the sixth embodiment are similar to those of the power converter 400 according to the aforementioned fourth embodiment.

[Seventh Embodiment]

A seventh embodiment is now described with reference to FIGS. 14 to 18. In this seventh embodiment, heat radiating fins 731 and 732 and an air guide duct 740 having the same structures as the heat radiating fins 31 and 32 and the air guide duct 40 according to the aforementioned first embodiment, respectively, are provided on a side surface of a semiconductor device 720. In the figures, structures of the seventh embodiment similar to those of the aforementioned first embodiment are denoted by the same reference signs.

Figure 14:
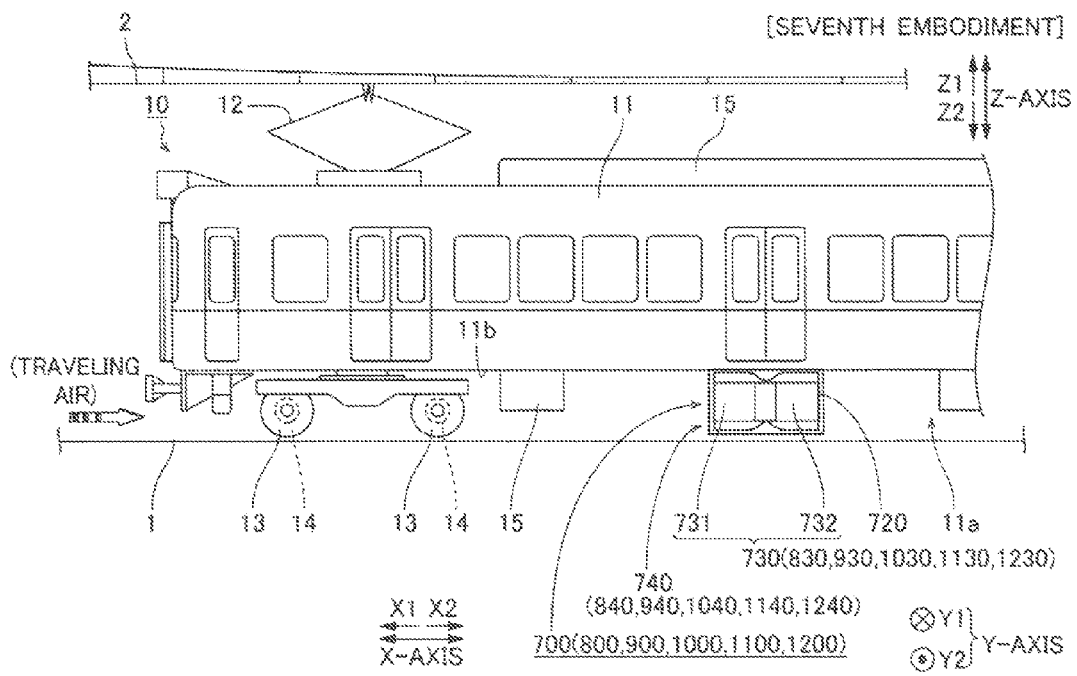
FIG. 14 is a side elevational view showing a railroad vehicle according to a seventh embodiment of the present invention.
Figure 15:
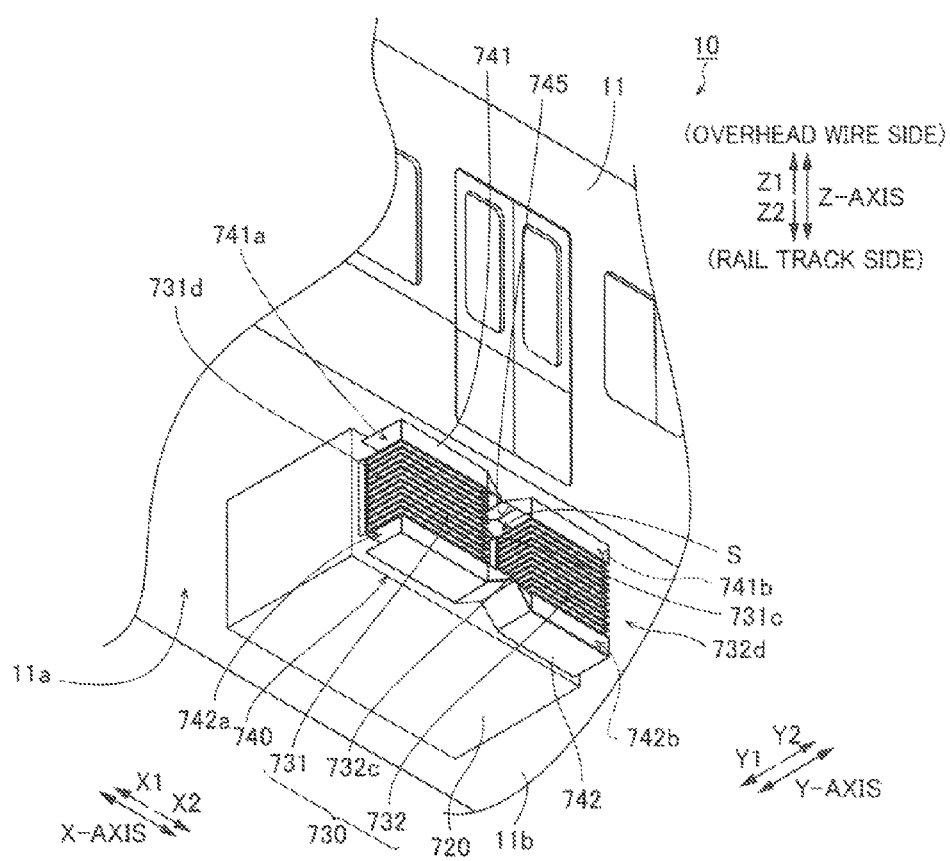
FIG. 15 is a perspective view of the railroad vehicle according to the seventh embodiment of the present invention, as viewed from obliquely below.

A power converter 700 according to the seventh embodiment of the present invention is placed on an underfloor space 11a of a vehicle body 11 of a railroad vehicle 10, as shown in FIGS. 14 and 15.

(Structure of Power Converter)

The power converter 700 includes a cooling portion 730 arranged on the side surface of the semiconductor device 720 on one side (Y2 side) in a Y-axis direction. The cooling portion 730 includes the heat radiating fin 731 (X1 side) and the heat radiating fin 732 (X2 side) arranged at a predetermined interval along an X-axis direction in which the vehicle body 11 extends. The heat radiating fins 731 and 732 each extend laterally away from the side surface of the semiconductor device 720 on the Y2 side and extend in a thin plate shape along the X-axis direction. The heat radiating fins 731 and 732 are examples of the "first heat radiating fin" and the "second heat radiating fin" in the claims, respectively.

Figure 16:
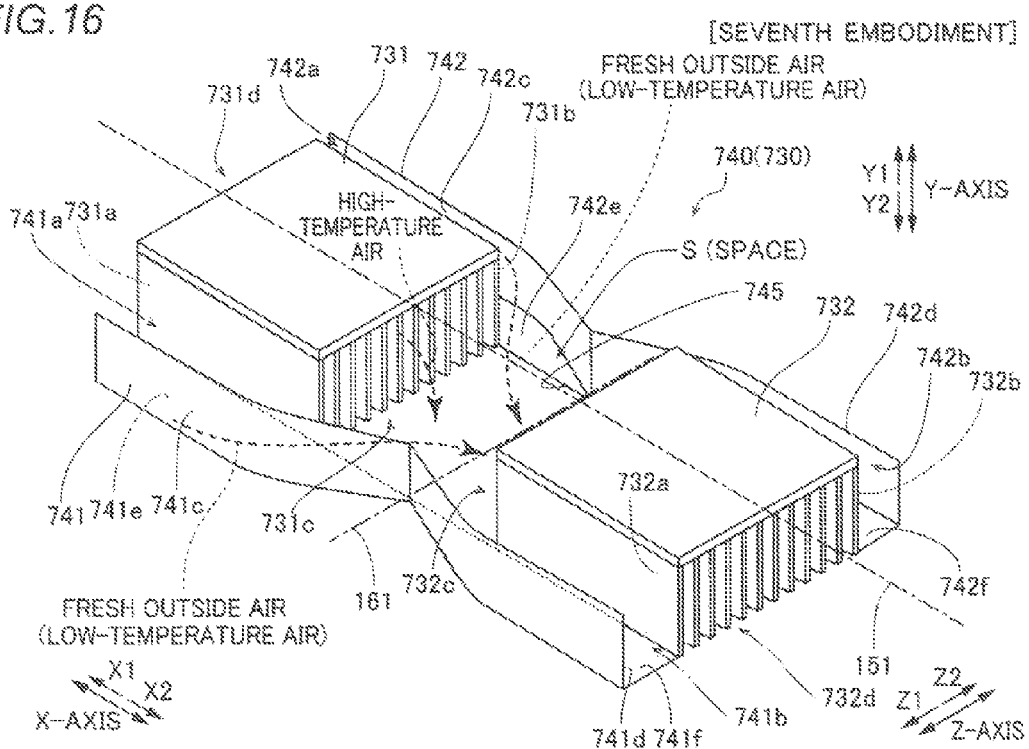
FIG. 16 is a perspective view showing the cooling structure of a power converter according to the seventh embodiment of the present invention.

According to the seventh embodiment, the air guide duct 740 is placed on the heat radiating fins 731 and 732, as shown in FIGS. 15 and 16. In FIG. 16, illustration of the semiconductor device 720 (see FIG. 15) mounted on a side surface of the cooling portion 730 on a Y1 side is omitted in order to show an arrangement relationship between the heat radiating fins 731 and 732 and the air guide duct 740.

(Structure of Air Guide Duct)

Figure 18:
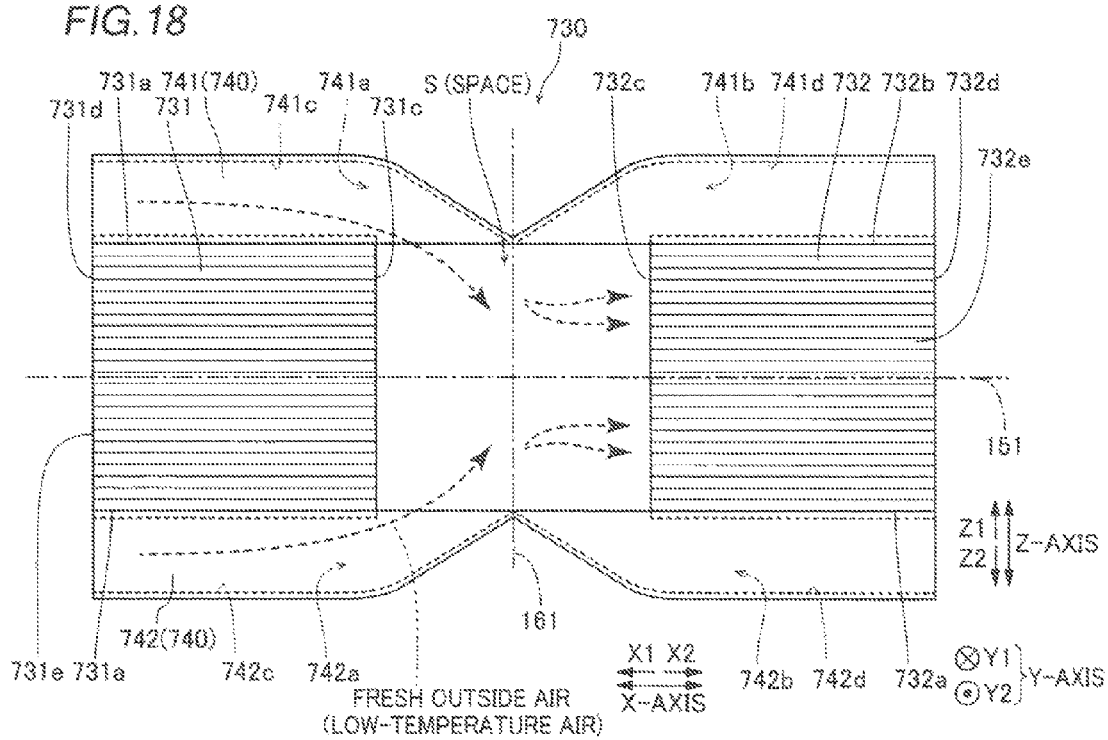
FIG. 18 is a side elevational view showing the cooling structure of the power converter according to the seventh embodiment of the present invention.

The air guide duct 740 includes a duct portion 741 continuously arranged along an outer surface 731a (732a) of the heat radiating fin 731 (732) on one side (Z1 side) along a vertical direction (Z-axis direction) and a duct portion 742 continuously arranged along an outer surface 731b (732b) of the heat radiating fin 731 (732) on the other side (Z2 side) along the vertical direction, as shown in FIG. 16. The duct portions 741 and 742 are line-symmetric in the vertical direction with respect to a centerline 151 (one-dot chain line) of the vehicle body 11 that extends in the X-axis direction, as shown in FIG. 18. The structure of the duct portion 741 on the Z1 side is described below in detail, and the overall structure of the air guide duct 740 is described below while the structure of the duct portion 742 on the Z2 side is additionally described as needed. The outer surfaces 731a, 731b, 732a, and 732b are examples of the "side end" in the claims.

A side surface 741c of a flow path 741a of the duct portion 741 linearly extends from an end 731d of the heat radiating fin 731 on the X1 side to an end 731c of the heat radiating fin 731 on the X2 side along the outer surface 731a on the Z1 side, and then is inclined downward (along arrow Z2) toward the centerline 151 at the end 731c on the X2 side. Similarly, a side surface 741d of a flow path 741b linearly extends from an end 732d of the heat radiating fin 732 on the X2 side to an end 732c of the heat radiating fin 732 on the X1 side along the outer surface 732b on the Z1 side, and then is inclined downward (along arrow Z1) toward the centerline 151 at the end 732c on the X1 side. The widths of surfaces 741e and 741f on the Y2 side are reduced in a direction toward each other. The ends 731c and 732c are examples of the "end of the other of the first heat radiating fin and the second heat radiating fin in the running direction" in the claims.

The duct portion 742 is line-symmetric in the vertical direction with respect to the centerline 151 (one-dot chain line) that extends in the X-axis direction such that the duct portion 742 is configured similarly to the duct portion 741. Thus, the air guide duct 740 as a whole is integrally provided in the cooling portion 730 from the heat radiating fin 731 to the heat radiating fin 732.

Thus, according to the seventh embodiment, when the air guide duct 740 is provided so that the railroad vehicle 10 (see FIG. 14) is running along arrow X1, air (traveling air) is taken from the duct portions 741 and 742, and the taken air is guided to a space S between the heat radiating fin 731 and the heat radiating fin 732. The air guided to the space S is guided to the end 732c of the heat radiating fin 732 in the running direction. The air guide duct 740 as a whole has a function of taking the air (traveling air) from the opposite sides of the heat radiating fin 731 on the X1 side and the Z1 side and on the X1 side and the Z2 side, guiding the taken air toward a central portion in the space S through the duct portions 741 and 742 (flow paths 741a and 742a), and then introducing this air guided toward the central portion in the space S to the end 732c of the heat radiating fin 732 in the running direction.

The air guide duct 740 is formed with an opening 745 that is open laterally (Y2 side) away from the semiconductor device 720 in the space S. The air guide duct 740 discharges air that has cooled the heat radiating fin 731 outward (laterally) through the opening 745, and guides the air taken from the opposite sides (the flow paths 741a and 742a) of a windward portion of the heat radiating fin 731 to the end 732c of the heat radiating fin 732 in the running direction through the space S.

Figure 17:
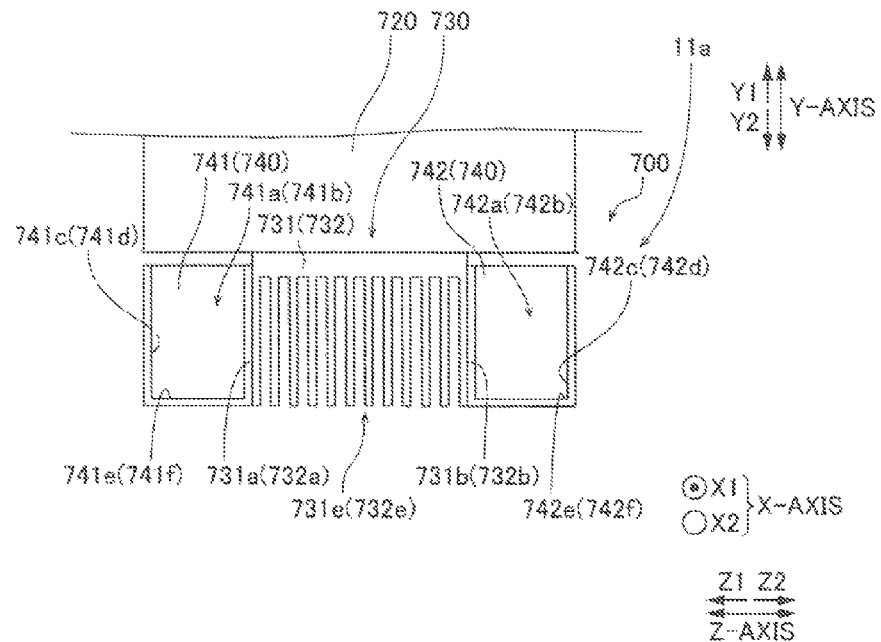
FIG. 17 is a sectional view showing the cooling structure of the power converter according to the seventh embodiment of the present invention.

According to the seventh embodiment, the duct portion 741 extends along the outer surface 731a (732a) of each of the heat radiating fins 731 and 732 on the Z1 side along the running direction (X-axis direction) in a state where a side surface region 731e (732e) of each of the heat radiating fins 731 and 732 is exposed toward a lateral side of the railroad vehicle 10 on the Y2 side, as shown in FIGS. 17 and 18. Similarly, the duct portion 742 extends along the outer surface 731b (732b) of each of the heat radiating fins 731 and 732 on the Z2 side in a state where the side surface region 731e (732e) of each of the heat radiating fins 731 and 732 is exposed toward the lateral side of the railroad vehicle 10 on the Y2 side.

According to the seventh embodiment, the air guide duct 740 has a symmetric shape in the running direction with respect to a centerline 161 (one-dot chain line) along the vertical direction (Z-axis direction) perpendicular to the running direction (X-axis direction) in the space S, as shown in FIG. 18. The remaining structures of the power converter 700 according to the seventh embodiment are similar to those of the power converter 100 according to the aforementioned first embodiment.

(Effects of Seventh Embodiment)

According to the seventh embodiment, the following effects can be obtained.

According to the seventh embodiment, as hereinabove described, the power converter 700 includes the air guide duct 740 that takes the air from the lateral sides of one of the heat radiating fin 731 and the heat radiating fin 732, guides the taken air to the space S between the heat radiating fin 731 and the heat radiating fin 732, and then guides the taken air to the end 732c (731c) of the other of the heat radiating fin 731 and the heat radiating fin 732 in the running direction when the railroad vehicle 10 is running. Thus, the overall cooling performance (radiation performance) of the cooling portion 730 that the railroad vehicle 10 includes can be improved, similarly to the aforementioned first embodiment.

According to the seventh embodiment, the air guide duct 740 is provided across the space S between the heat radiating fin 731 and the heat radiating fin 732. Thus, regardless of the running direction of the railroad vehicle 10, the air taken from the lateral sides of one of the heat radiating fin 731 and the heat radiating fin 732 can be reliably guided to the space S and be reliably supplied to the end 732c (731c) of the other of the heat radiating fin 731 and the heat radiating fin 732 in the running direction.

According to the seventh embodiment, the duct portion 741 that the air guide duct 740 includes is provided on the outer surfaces 731a and 732a of the heat radiating fins 731 and 732 on the Z1 side in the vertical direction, and the duct portion 742 that the air guide duct 740 includes is provided on the outer surfaces 731b and 732b of the heat radiating fins 731 and 732 on the Z2 side in the vertical direction. In a state where air has been taken from the opposite lateral sides of one of the heat radiating fins 731 and 732 and the taken air has been guided toward the central portion in the space S through the air guide duct 740, the air guide duct 740 introduces this air to the end 732c (731c) of the other of the heat radiating fins 731 and 732 in the running direction. Thus, the taken air (traveling air) can be reliably accumulated in the space S by effectively utilizing the duct portion 741 on the Z1 side of the heat radiating fin 731 (heat radiating fin 732) and the duct portion 742 on the Z2 side of the heat radiating fin 731 (heat radiating fin 732), and the accumulated air before heat exchange can be efficiently supplied to the end 732c (731c) of the heat radiating fin 732 (heat radiating fin 731) in the running direction. Furthermore, air can be taken from the opposite lateral sides of the heat radiating fin 731 (or the heat radiating fin 732), and hence the supply of the air to the end 732c (731c) of the heat radiating fin 732 (or the heat radiating fin 731) can be uniformized (stabilized). Thus, the radiation performance of the heat radiating fin 732 (or the heat radiating fin 731) can be stably obtained.

According to the seventh embodiment, the air guide duct 740 guides the air toward the central portion in the space S by bending the side surface 741c (741d) of the air guide duct 740 on the Z1 side and the side surface 742c (742d) of the air guide duct 740 on the Z2 side toward the central portion (centerline 151) in the space S, and introduces the air to the end 732c (731c) of the heat radiating fin 732 (or the heat radiating fin 731) in the running direction. Thus, the air (traveling air) taken by more effectively utilizing the duct portion 741 on the Z1 side of the heat radiating fin 731 (heat radiating fin 732) and the duct portion 742 on the Z2 side of the heat radiating fin 731 (heat radiating fin 732) can be reliably accumulated in the space S between the heat radiating fin 731 and the heat radiating fin 732 along the side surface 741c (741d, 742c, 742d) of the air guide duct 740 bent toward the central portion.

According to the seventh embodiment, the heat radiating fins 731 and 732 are placed in the underfloor space 11a of the railroad vehicle 10, and the air guide duct 740 discharges the air that has cooled one of the heat radiating fins 731 and 732 to the space S between the heat radiating fin 731 and the heat radiating fin 732, and guides the air taken from the lateral sides of one of the heat radiating fins 731 and 732 to the end 732c (731c) of the other of the heat radiating fins 731 and 732 in the running direction through the space S. Thus, the radiation performance of the heat radiating fin 731 (or the heat radiating fin 732) on an upstream side and the radiation performance of the heat radiating fin 732 (or the heat radiating fin 731) on a downstream side can be maximally obtained and be maintained at the equivalent level to each other, similarly to the aforementioned first embodiment.

According to the seventh embodiment, the opening 745 that is open outward in the space S is provided in the air guide duct 740, and the air guide duct 740 discharges the air that has cooled one of the heat radiating fins 731 and 732 outward through the opening 745, and guides the air taken from the lateral sides of one of the heat radiating fins 731 and 732 to the end 732c (731c) of the other of the heat radiating fins 731 and 732 in the running direction through the space S. Thus, high-temperature air can be easily discharged outward (to the atmosphere) through the opening 745, and fresh outside air (low-temperature air) taken through the air guide duct 740, by which the high-temperature air to be discharged outward is replaced can be easily guided to the end 732c of the heat radiating fin 732 (or the end 731c of the heat radiating fin 731).

According to the seventh embodiment, the air guide duct 740 extends along the outer surface 731a (732a) or the outer surface 731b (732b) of each of the heat radiating fins 731 and 732 along the running direction in a state where the entire side surface region 731e (732e) of each of the heat radiating fins 731 and 732 is exposed laterally of the railroad vehicle 10. Thus, areas of the heat radiating fins 731 and 732 exposed outward (to outside air) can be ensured, and hence the radiation performance of the heat radiating fins 731 and 732 can be maintained even when the traveling air tends to become insufficient due to a reduction in the running speed of the railroad vehicle 10.

According to the seventh embodiment, the air guide duct 740 is integrally provided from the heat radiating fin 731 to the heat radiating fin 732. Thus, the air guide duct 740 to be mounted on the heat radiating fins 731 and 732 is a unitary monolithic component, and an increase in the number of components in the power converter 700 can be suppressed. Furthermore, the structure around the power converter 700 can be simplified, and hence maintenance can be easily performed.

According to the seventh embodiment, the heat radiating fins 731 and 732 extend toward the lateral side of the railroad vehicle 10 on the Y2 side, and the air guide duct 740 extends in the running direction on the outer surface 731a (732a) of each of the heat radiating fins 731 and 732. Thus, a reduction in the radiation performance of an entire plurality of heat radiating fins 731 and 732 (entire cooling portion 730) can be suppressed by efficiently utilizing the traveling air taken from the lateral side of the railroad vehicle 10 along with the running of the railroad vehicle 10. Furthermore, as compared with the case where the heat radiating fins 731 and 732 extend downward in a state where the same are arranged on a lower portion of the semiconductor device 720, the cooling portion 730 can be configured such that the semiconductor device 720 is not located on upper portions of the heat radiating fins 731 and 732 and the air guide duct 740, and hence the high-temperature air that is likely to flow upward can be efficiently discharged from the upper portions. Consequently, the overall radiation performance of the cooling portion 730 (heat radiating fins 731 and 732) can be improved.

According to the seventh embodiment, the air guide duct 740 has the symmetric shape in the running direction with respect to the centerline 161 along the vertical direction perpendicular to the running direction in the space S. Thus, regardless of the running direction of the railroad vehicle 10, the effects of the seventh embodiment can be sufficiently obtained. The remaining effects of the power converter 700 according to the seventh embodiment are similar to those of the power converter 100 according to the aforementioned first embodiment.

[Eighth Embodiment]

An eighth embodiment is now described with reference to FIGS. 14, 19, and 20. In this eighth embodiment, the shape of an air guide duct 840 in a space S is different from that in the aforementioned seventh embodiment. In the figures, structures of the eighth embodiment similar to those of the aforementioned seventh embodiment are denoted by the same reference signs.

Figure 19:
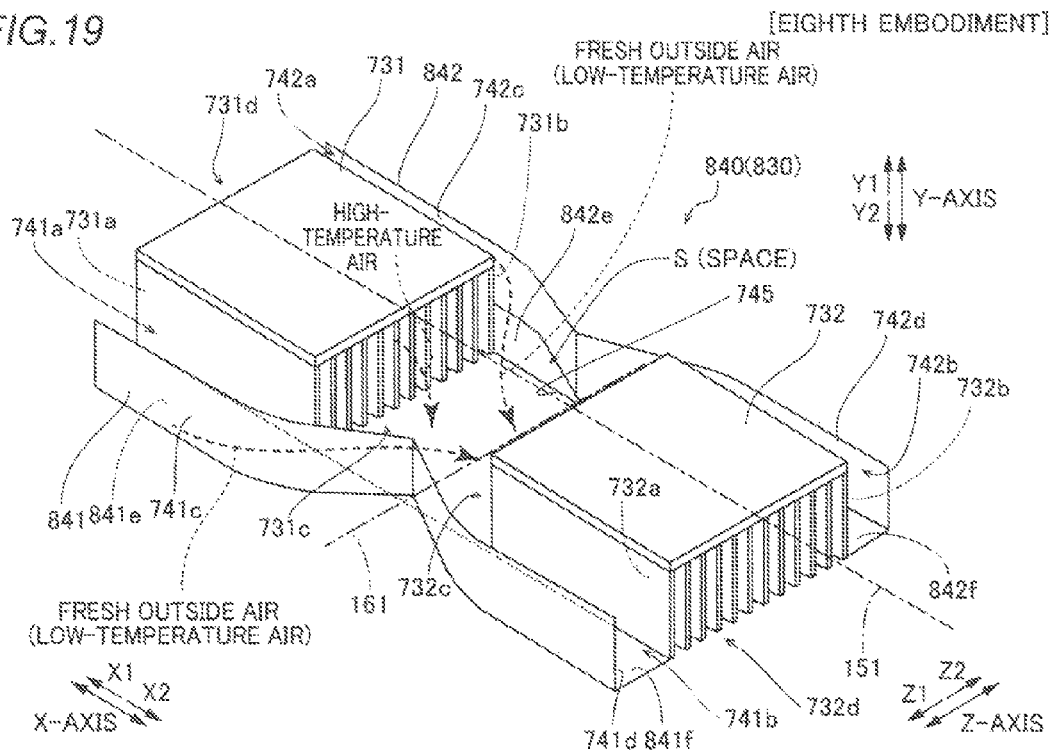
FIG. 19 is a perspective view showing the cooling structure of a power converter according to an eighth embodiment of the present invention.

A power converter 800 (see FIG. 14) according to an eighth embodiment of the present invention includes a cooling portion 830, as shown in FIG. 19. The air guide duct 840 is placed on a set of heat radiating fins 731 and 732 of the cooling portion 830.

Figure 20:
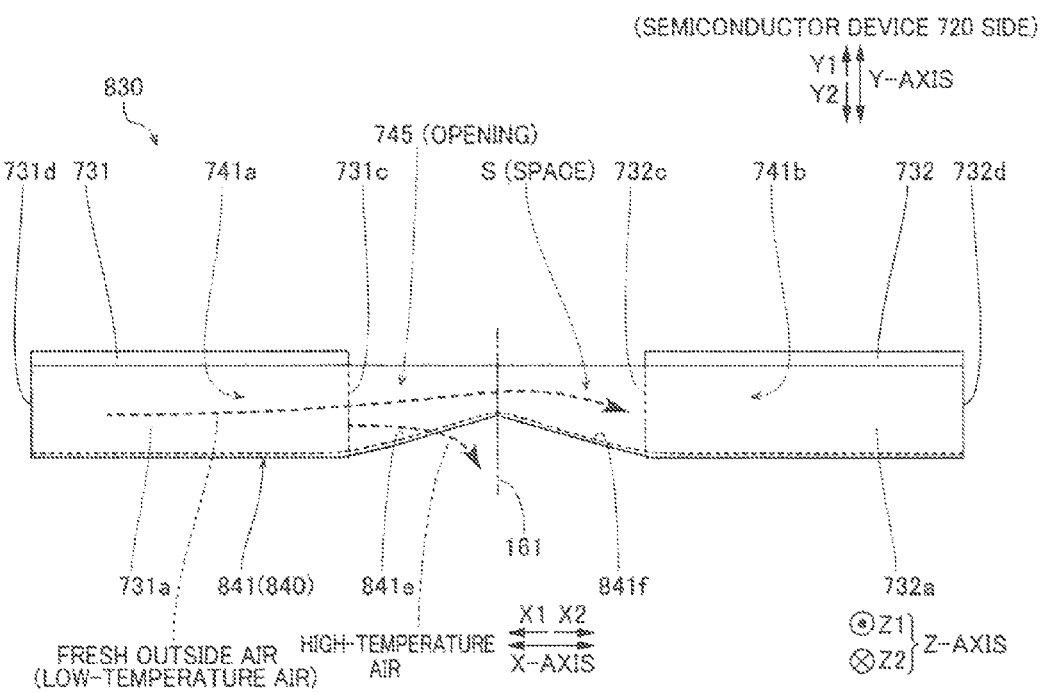
FIG. 20 is a top view showing the cooling structure of the power converter according to the eighth embodiment of the present invention.

According to the eighth embodiment, the air guide duct 840 guides air toward a central portion in the space S in a state where surfaces 841e and 841f (surfaces 842e and 842f) of the air guide duct 840 on a Y2 side are bent toward a semiconductor device 720 (along arrow Y1) and toward the central portion in the space S such that the air is bent toward the semiconductor device 720 in the vicinity of an entrance of the space S, as shown in FIGS. 19 and 20. Therefore, when a railroad vehicle 10 (see FIG. 14) is running along arrow X1, fresh outside air (low-temperature air) not subjected to heat exchange in the heat radiating fin 731 can be guided toward the central portion in the space S while passing through a portion closer to the semiconductor device 720 above high-temperature air heated by heat exchange in the heat radiating fin 731 in the space S. The high-temperature air subjected to heat exchange in the heat radiating fin 731 is discharged outward through an opening 745 provided in the space S. Consequently, the fresh outside air (low-temperature air) not subjected to heat exchange in the heat radiating fin 731 is efficiently accumulated in the space S and is reliably supplied to an end 732c of the heat radiating fin 732.

When the railroad vehicle 10 is running along arrow X2, traveling air is taken from the heat radiating fin 732 side (X2 side) in the air guide duct 840, and similarly contributes to suppression of a reduction in the radiation performance of the heat radiating fin 731 on a leeward side.

The structure of the cooling portion 830 of the power converter 800 according to the eighth embodiment is substantially the same as the structure in which the cooling portion 230 provided on the lower surface of the semiconductor device 20 of the power converter 200 according to the aforementioned second embodiment is provided on a side surface of the semiconductor device 720 on the Y2 side. The remaining structures of the power converter 800 according to the eighth embodiment are similar to those of the power converter 700 according to the aforementioned seventh embodiment.

(Effects of Eighth Embodiment)

According to the eighth embodiment, as hereinabove described, the air guide duct 840 takes air from the opposite lateral sides of a windward portion of the heat radiating fin 731 or 732, and guides the taken air toward the central portion in the space S in a state where the taken air is bent toward the semiconductor device 720 (along arrow Y1) in the vicinity of the space S. Thus, the fresh outside air (low-temperature air) not subjected to heat exchange in the heat radiating fin 731 (or the heat radiating fin 732) can be guided toward the central portion (a region in the vicinity of a centerline 151) in the space S in a state where the low-temperature air passes through the portion closer to the semiconductor device 720 above the high-temperature air heated by heat exchange in the heat radiating fin 731 (or the heat radiating fin 732) in the space S. Therefore, the fresh outside air (low-temperature air) can be reliably supplied to the end 732c of the heat radiating fin 732 (or an end 731c of the heat radiating fin 731).

According to the eighth embodiment, the air guide duct 840 guides the air toward the central portion in the space S in a state where the surfaces 841e and 841f (surfaces 842e and 842f) of the air guide duct 840 on the Y2 side are bent toward the semiconductor device 720 (along arrow Y1) in the space S such that the air is bent toward the semiconductor device 720 in the vicinity of the space S. Thus, the flow of the low-temperature air (fresh outside air) guided toward the central portion (the region in the vicinity of the centerline 151) in the space S can be easily formed in the space S between the heat radiating fin 731 and the heat radiating fin 732. The remaining effects of the power converter 800 according to the eighth embodiment are similar to those of the power converter 700 according to the aforementioned seventh embodiment.

[Modification]

The embodiments disclosed this time must be considered as illustrative in all points and not restrictive. The range of the present invention is shown not by the above description of the embodiments but by the scope of claims for patent, and all modifications within the meaning and range equivalent to the scope of claims for patent are further included.

Figure 21:
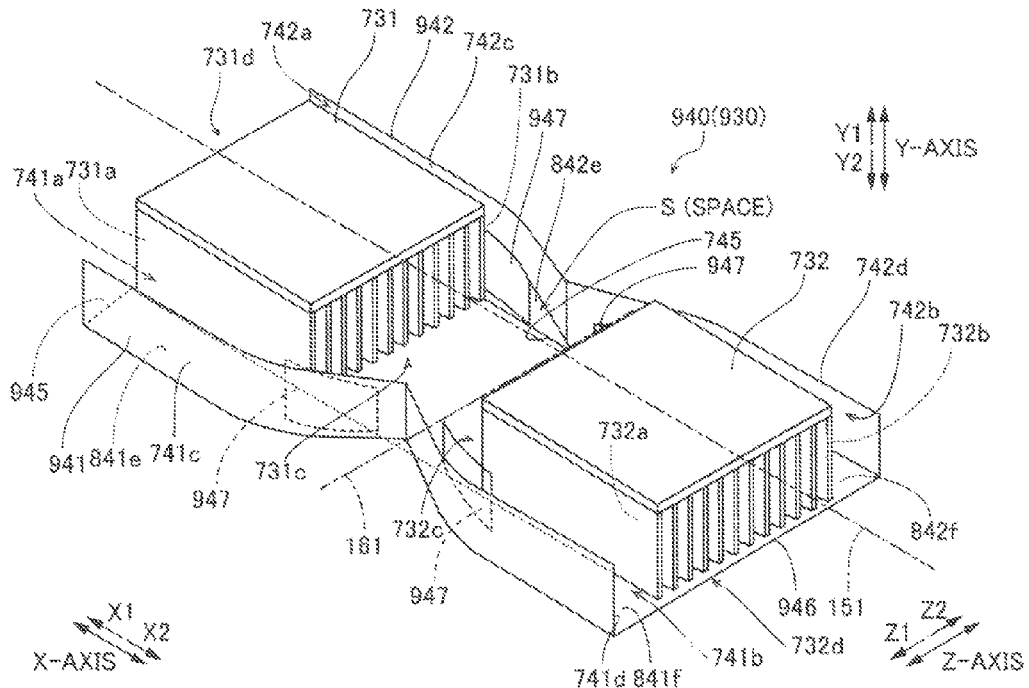
FIG. 21 is a perspective view showing the cooling structure of a power converter according to a modification of the third embodiment of the present invention.
Figure 22:
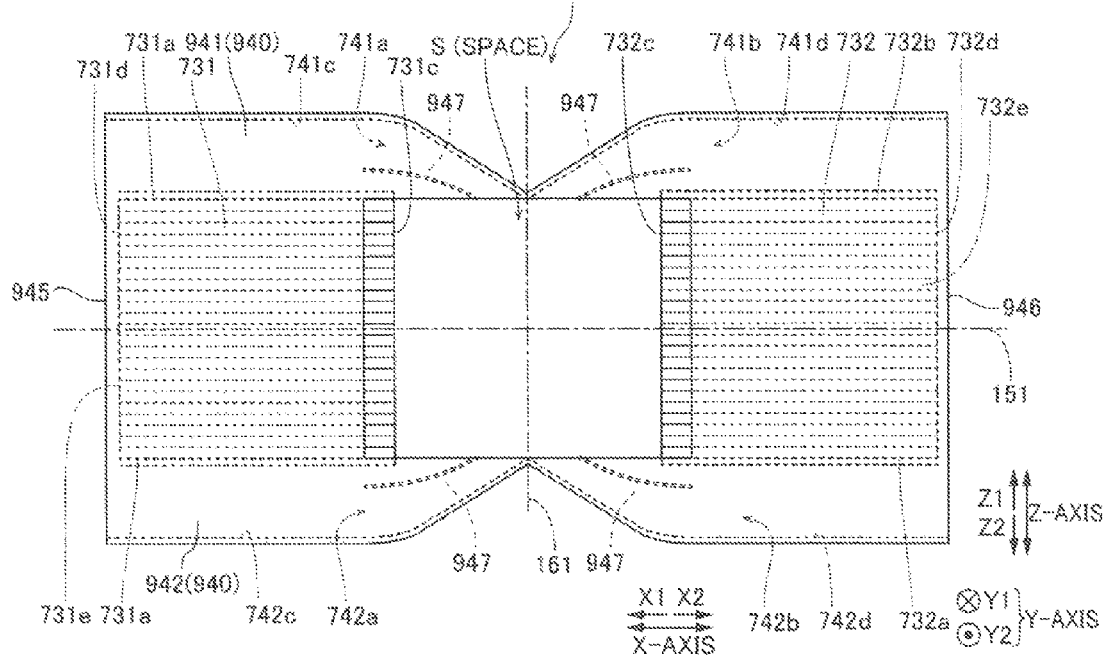
FIG. 22 is a side elevational view showing the cooling structure of the power converter according to a modification of the third embodiment of the present invention.

For example, the cooling portion 330 according to the aforementioned third embodiment may alternatively be provided on the side surface of the semiconductor device 720 on the Y2 side, similarly to the aforementioned seventh and eighth embodiments. In other words, as in a power converter 900 according to a modification of the third embodiment shown in FIGS. 14, 21, and 22, an air guide duct 940 may be configured such that side surface regions 731e and 732e of heat radiating fins 731 and 732 of a cooling portion 930 are covered. Thus, an end 945 of the air guide duct 940 on an X1 side and an end 946 of the air guide duct 940 on an X2 side are arranged on the X1 side with respect to an end 731d of the heat radiating fin 731 and on the X2 side with respect to an end 732d of the heat radiating fin 732, respectively. Alternatively, air direction plates 947 that guide traveling air from the air guide duct 940 toward a centerline 151 in a running direction (X-axis direction) may be provided.

Figure 23:
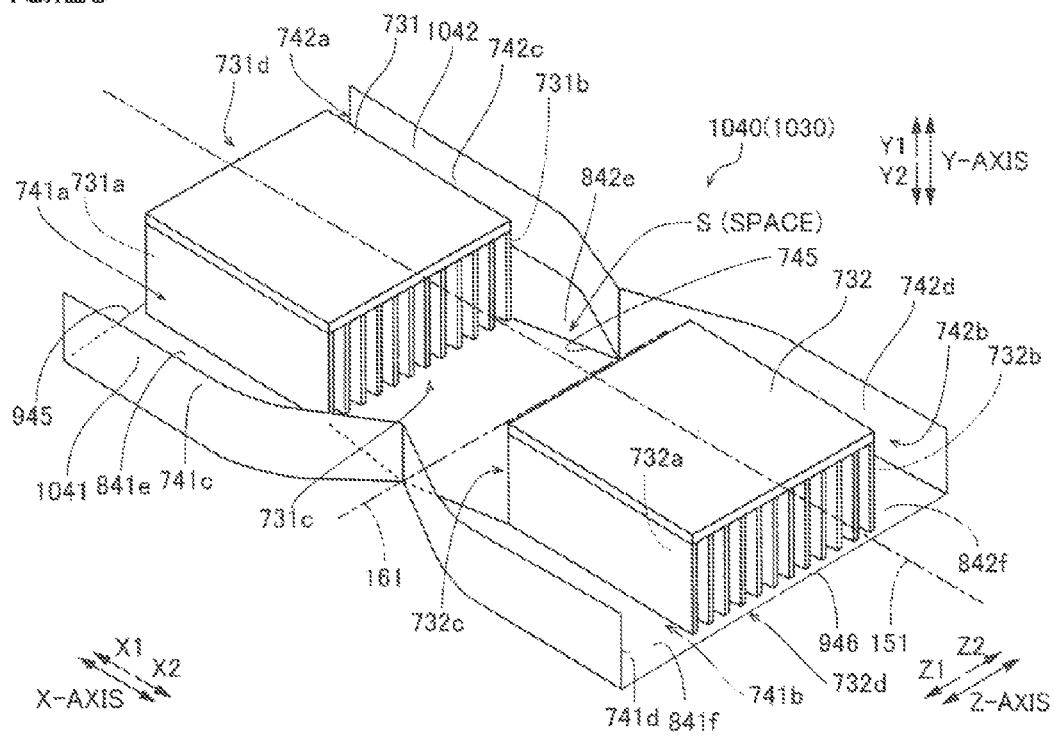
FIG. 23 is a perspective view showing the cooling structure of a power converter according to a modification of the fourth embodiment of the present invention.

The cooling portion 430 according to the aforementioned fourth embodiment may alternatively be provided on the side surface of the semiconductor device 720 on the Y2 side, similarly to the aforementioned seventh and eighth embodiments. In other words, as in a power converter 1000 according to a modification of the fourth embodiment shown in FIGS. 14 and 23, the size of an air guide duct 1040 (duct portions 1041 and 1042) of a cooling portion 1030 may be increased in a vertical direction (Z-axis direction).

Figure 24:
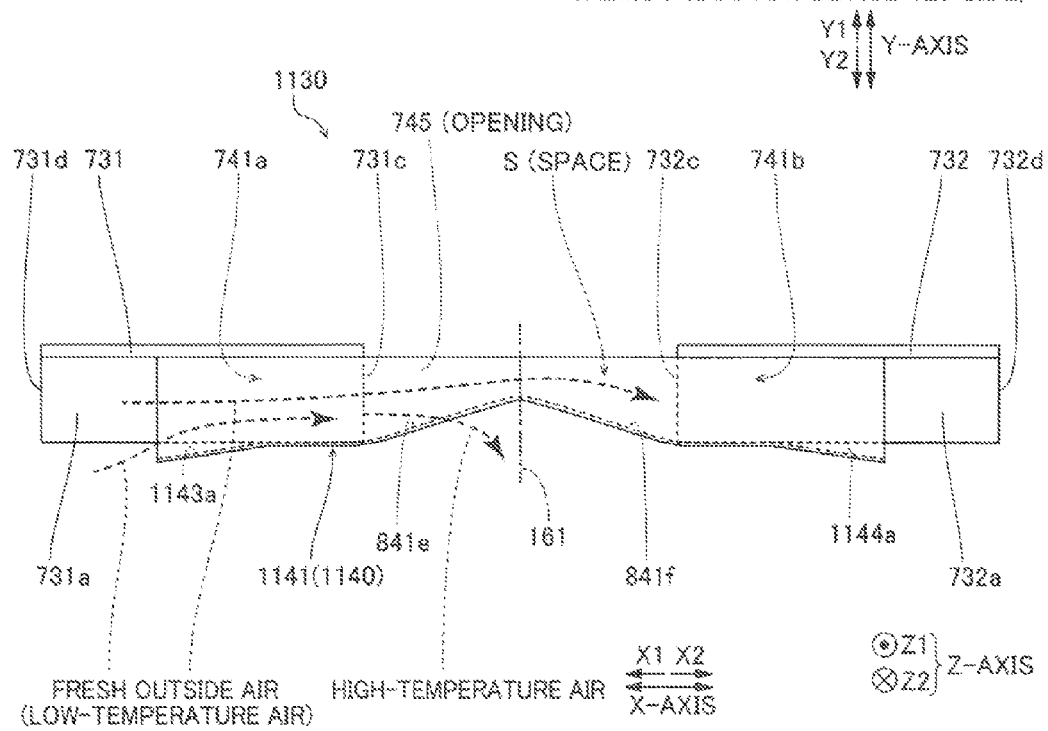
FIG. 24 is a top view showing the cooling structure of a power converter according to a modification of the fifth embodiment of the present invention.

The cooling portion 530 according to the aforementioned fifth embodiment may alternatively be provided on the side surface of the semiconductor device 720 on the Y2 side, similarly to the aforementioned seventh and eighth embodiments. In other words, as in a power converter 1100 according to a modification of the fifth embodiment shown in FIGS. 14, 24, and 25, the size of an air guide duct 1140 (duct portions 1141 and 1142) of a cooling portion 1130 may be reduced in a running direction (X-axis direction) such that portions near one ends 731d and 732d of a pair of heat radiating fins 731 and 732 in the running direction are not covered. Alternatively, side surfaces 1143a and 1144a inclined in a direction (along arrow Y2) away from a semiconductor device 720 may be provided on opposite ends of the air guide duct 1140 in the running direction.

The cooling portion 630 according to the aforementioned sixth embodiment may alternatively be provided on the side surface of the semiconductor device 720 on the Y2 side, similarly to the aforementioned seventh and eighth embodiments. In other words, as in a power converter 1200 according to a modification of the sixth embodiment shown in FIGS. 14 and 26, an air guide duct 1240 of a cooling portion 1230 may surround a space S between heat radiating fins 731 and 732 by a connection portion 1243 without providing an opening 745 (see FIG. 16) in the air guide duct 1240.

While the present invention is applied to the power converters 100 to 1200 placed in the underfloor space 11a of the vehicle body 11 in the aforementioned first to eighth embodiments and modifications of the third to sixth embodiments, the present invention is not restricted to this. The present invention may alternatively be applied to cool the "power converter body" placed on a roof of the vehicle body 11, for example.

While the present invention is applied to the power converters 100 to 1200 of the catenary railroad vehicle 10 that runs using electric power from the overhead wire 2 in the aforementioned first to eighth embodiments and modifications of the third to sixth embodiments, the present invention is not restricted to this. More specifically, the present invention may alternatively be applied to cool a power converter of a third rail type railroad vehicle 10 that collects electric power by scraping a collector shoe provided on a vehicle body 11 against a third rail for power feeding (third rail) separately laid along a rail for running.

While the present invention is applied to the power converters 100 to 1200 of the catenary railroad vehicle 10 that runs using electric power from the overhead wire 2 in the aforementioned first to eighth embodiments and modifications of the third to sixth embodiments, the present invention is not restricted to this. More specifically, the present invention may alternatively be applied to cool a device mounted on a diesel railcar that uses a diesel engine as a direct drive source or cool a power converter of a railroad vehicle 10 such as an electric diesel railcar that rotates induction motors 14 by power generation of a diesel engine.

While the cooling portions 730 to 1230 are provided on the side surface of the semiconductor device 720 on the Y2 side in the aforementioned first to eighth embodiments and modifications of the third to sixth embodiments, the present invention is not restricted to this. According to the present invention, any of the cooling portions 730 to 1230 may alternatively be provided on the side surface of the semiconductor device 720 on the Y1 side. In this case, any of the cooling portions 730 to 1230 may be provided on both the side surfaces of the semiconductor device 720 on the Y1 side and the Y2 side, or may be provided on only one of the side surfaces of the semiconductor device 720 on the Y1 side and the Y2 side.

While the cooling portions 30 to 630 are provided on the lower surface of the semiconductor device 20 in the aforementioned first to sixth embodiments and the cooling portions 730 to 1230 are provided on the side surface of the semiconductor device 720 on the Y2 side in the aforementioned seventh and eighth embodiments and modifications of the third to sixth embodiments, the present invention is not restricted to this. According to the present invention, the cooling portions may alternatively be provided on both the lower surface and the side surface of the semiconductor device (power converter body). For example, the cooling portion 30 provided on the lower surface of the semiconductor device according to the aforementioned first embodiment and the cooling portion 730 provided on the side surface of the semiconductor device according to the aforementioned seventh embodiment may be provided on the same semiconductor device.

What is claimed is:

1. A power converter for a railroad vehicle comprising:
a power converter body;
a first heat radiating fin that is arranged on a first side of the power converter body in a running direction of the railroad vehicle to extend along the running direction and radiates heat of the power converter body mounted on the railroad vehicle;
a second heat radiating fin that is arranged at a predetermined interval from the first heat radiating fin on a second side of the power converter body in the running direction to extend along the running direction and radiates the heat of the power converter body;
an air guide duct that takes air from a lateral side of one of the first heat radiating fin and the second heat radiating fin, guides the taken air to a region between the first heat radiating fin and the second heat radiating fin, and then guides the taken air to an end of the other of the first heat radiating fin and the second heat radiating fin in the running direction when the railroad vehicle is running,
the first heat radiating fin and the second heat radiating fin are arranged apart from one another in a longitudinal direction of the railroad vehicle,
the air guide duct is provided on side portions of each of the first heat radiating fin and the second heat radiating fin, and
the air guide duct includes a bending portion configured such that a side surface of the air guide duct is bent toward a central portion in the region so that the taken air from the side portions of one of the first heat radiating fin and the second heat radiating fin is guided toward the central portion in the region.

2. The power converter for a railroad vehicle according to claim 1, wherein the air guide duct is provided across the region between the first heat radiating fin and the second heat radiating fin.

3. The power converter for a railroad vehicle according to claim 1, wherein
the air guide duct is provided on opposite side ends of each of the first heat radiating fin and the second heat radiating fin in a direction perpendicular to the running direction, and
in a state where the air has been taken from opposite lateral sides of one of the first heat radiating fin and the second heat radiating fin and the taken air has been guided toward the central portion in the region through the air guide duct, the air guide duct introduces the air to an end of the other of the first heat radiating fin and the second heat radiating fin in the running direction by the bending portion.

4. The power converter for a railroad vehicle according to claim 3, wherein
the air guide duct is configured such that the bending portion guides the air toward the central portion in the region by bending a side surface of the air guide duct toward the central portion in the region, and introduces the air to the end of the other of the first heat radiating fin and the second heat radiating fin in the running direction.

5. The power converter for a railroad vehicle according to claim 3, wherein the air guide duct takes air from the opposite lateral sides, and guides the taken air toward the central portion in the region in a state where the taken air is bent toward the power converter body in a vicinity of the region.

6. The power converter for a railroad vehicle according to claim 5, wherein the air guide duct guides the air toward the central portion in the region in a state where a surface of the air guide duct opposite to the power converter body is bent toward the power converter body in the region to bend the air toward the power converter body in the vicinity of the region.

7. The power converter for a railroad vehicle according to claim 1, wherein
the first heat radiating fin and the second heat radiating fin are placed in an underfloor space of the railroad vehicle, and the air guide duct discharges air that has cooled one of the first heat radiating fin and the second heat radiating fin to the region between the first heat radiating fin and the second heat radiating fin, and guides the air taken from the lateral side of one of the first heat radiating fin and the second heat radiating fin to the end of the other of the first heat radiating fin and the second heat radiating fin in the running direction through the region.

8. The power converter for a railroad vehicle according to claim 7, wherein
the air guide duct includes an opening that is open outward in the region, and
the air guide duct discharges the air that has cooled one of the first heat radiating fin and the second heat radiating fin outward through the opening, and guides the air taken from the lateral side of one of the first heat radiating fin and the second heat radiating fin to the end of the other of the first heat radiating fin and the second heat radiating fin in the running direction through the region.

9. The power converter for a railroad vehicle according to claim 7, wherein the air guide duct extends along a side end of each of the first heat radiating fin and the second heat radiating fin along the running direction in a state where a surface of each of the first heat radiating fin and the second heat radiating fin opposite to the power converter body is at least partially exposed.

10. The power converter for a railroad vehicle according to claim 7, wherein the air guide duct covers, from a side opposite to the power converter body, an end of each of the first heat radiating fin and the second heat radiating fin in a direction perpendicular to the running direction, the end that extends along the running direction, and extends along the end in the direction perpendicular to the running direction.

11. The power converter for a railroad vehicle according to claim 7, wherein the air guide duct protrudes to a windward side beyond an end of the first heat-radiating fin or the second heat radiating fin on a side from which air is taken when the railroad vehicle is running.

12. The power converter for a railroad vehicle according to claim 7, wherein
the air guide duct surrounds the region between the first heat radiating fin and the second heat radiating fin, and
the air guide duct mixes the air that has cooled one of the first heat radiating fin and the second heat radiating fin and the air taken from the lateral side of one of the first heat radiating fin and the second heat radiating fin and guided to the region, and guides the mixed air to the end of the other of the first heat radiating fin and the second heat radiating fin in the running direction.

13. The power converter for a railroad vehicle according to claim 1, wherein the air guide duct is integrally provided from the first heat radiating fin to the second heat radiating fin.

14. The power converter for a railroad vehicle according to claim 3, wherein
the first heat radiating fin and the second heat radiating fin extend downward of the railroad vehicle, and
the air guide duct extends along the running direction on the opposite side ends of each of the first heat radiating fin and the second heat radiating fin in a direction of crossties.

15. The power converter for a railroad vehicle according to claim 3, wherein
the first heat radiating fin and the second heat radiating fin extend laterally of the railroad vehicle, and
the air guide duct extends along the running direction on the opposite side ends of each of the first heat radiating fin and the second heat radiating fin in a vertical direction.

16. The power converter for a railroad vehicle according to claim 1, wherein the air guide duct has a symmetric shape in the running direction with respect to a centerline along a direction perpendicular to the running direction in the region between the first heat radiating fin and the second heat radiating fin.

* * * * *